(12) United States Patent
Jeon et al.

(10) Patent No.: US 12,336,202 B2
(45) Date of Patent: Jun. 17, 2025

(54) INTEGRATED CIRCUIT DEVICE

(71) Applicant: SAMSUNG ELECTRONICS CO., LTD., Suwon-si (KR)

(72) Inventors: Intak Jeon, Seoul (KR); Hanjin Lim, Seoul (KR); Hyungsuk Jung, Suwon-si (KR); Jaehyoung Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 430 days.

(21) Appl. No.: 17/805,702

(22) Filed: Jun. 7, 2022

(65) Prior Publication Data

US 2023/0105195 A1    Apr. 6, 2023

(30) Foreign Application Priority Data

Oct. 6, 2021   (KR) .................. 10-2021-0132680

(51) Int. Cl.
*H10D 1/68* (2025.01)
*H01G 4/10* (2006.01)
*H10B 12/00* (2023.01)
*H10D 1/00* (2025.01)

(52) U.S. Cl.
CPC ............. *H10D 1/696* (2025.01); *H01G 4/10* (2013.01); *H10B 12/03* (2023.02); *H10D 1/042* (2025.01); *H10D 1/694* (2025.01); *H10D 1/716* (2025.01)

(58) Field of Classification Search
CPC ........ H10D 1/696; H10D 1/716; H10D 1/694; H10D 1/042; H10B 12/03; H01G 4/10
See application file for complete search history.

(56) References Cited

U.S. PATENT DOCUMENTS

| | | | |
|---|---|---|---|
| 10,964,614 | B2 | 3/2021 | Lee et al. |
| 11,043,553 | B2 | 6/2021 | Kim et al. |
| 11,133,314 | B2 | 9/2021 | Jung et al. |
| 2016/0079247 | A1 | 3/2016 | Lim et al. |
| 2020/0258888 | A1 | 8/2020 | Kim et al. |

(Continued)

FOREIGN PATENT DOCUMENTS

| | | |
|---|---|---|
| KR | 10-2015-0101312 | 9/2015 |
| KR | 10-2020-0033010 | 3/2020 |

(Continued)

OTHER PUBLICATIONS

Office Action dated Jun. 28, 2023 in related T.W. Patent Application Serial No. 111137833.

*Primary Examiner* — Timor Karimy
(74) *Attorney, Agent, or Firm* — MORGAN, LEWIS & BOCKIUS LLP

(57) ABSTRACT

An integrated circuit device includes: a lower electrode disposed on a substrate; an insulating support pattern supporting the lower electrode; a dielectric film surrounding the lower electrode and the insulating support pattern; a high-k interface layer arranged between the lower electrode and the dielectric film and between the insulating support pattern and the dielectric film, wherein the high-k interface layer contacts the insulating support pattern and includes a zirconium oxide layer; and an upper electrode disposed adjacent the lower electrode, wherein the high-k interface layer and the dielectric film are disposed between the upper electrode and the lower electrode.

20 Claims, 20 Drawing Sheets

(56) References Cited

U.S. PATENT DOCUMENTS

| | | | |
|---|---|---|---|
| 2020/0266265 A1* | 8/2020 | Kang | ............... H10D 1/042 |
| 2020/0395438 A1 | 12/2020 | Kang et al. | |
| 2021/0028010 A1 | 1/2021 | Kim et al. | |
| 2021/0066446 A1 | 3/2021 | Lee et al. | |
| 2021/0134803 A1 | 5/2021 | Cho et al. | |
| 2021/0272961 A1* | 9/2021 | Tung | ............... H10B 12/34 |

FOREIGN PATENT DOCUMENTS

| | | |
|---|---|---|
| KR | 10-2020-0036600 | 4/2020 |
| KR | 10-2020-0141809 | 12/2020 |
| KR | 10-2021-0026529 | 3/2021 |
| KR | 10-2021-0053378 | 5/2021 |
| KR | 10-2021-0053379 | 5/2021 |

* cited by examiner

INTEGRATED CIRCUIT DEVICE

CROSS-REFERENCE TO RELATED APPLICATION

This application is based on and claims priority under 35 U.S.C. § 119 to Korean Patent Application No. 10-2021-0132680, filed on Oct. 6, 2021, in the Korean Intellectual Property Office, the disclosure of which is incorporated by reference herein in its entirety.

TECHNICAL FIELD

Embodiments of the inventive concept relate to an integrated circuit device, and more particularly, to an integrated circuit device including a capacitor.

DISCUSSION OF THE RELATED ART

User electronic devices have become ubiquitous in recent times. Semiconductor devices are used in several user electronic devices that process digital information. For example, mobile phones, watches, personal computers, and the like all utilize semiconductor devices. For example, semiconductor devices are used for implementing displays, processors, memory, etc.

As these electronics continue to be developed, semiconductor devices have been rapidly down-scaled, and thus, patterns within the devices have become smaller. Patterns such as finer pitch wiring, thinner insulating and connecting layers, etc. have all been developed to increase utilization of space. However, the reduction in size of the patterns and the connections may also cause undesired electrical characteristics, such as loss of charge, and changes to charges and data in adjacent components. Accordingly, there is a need to develop structures allowing fine-sized capacitors to have reduced leakage currents and maintain desired electrical characteristics.

SUMMARY

The inventive concept provides an integrated circuit device having a structure which allows a capacitor to have a reduced leakage current by preventing a bridge between lower electrodes that are storage nodes and to maintain desired electrical characteristics.

An integrated circuit device according to an aspect of the inventive concept includes: a lower electrode disposed on a substrate; an insulating support pattern supporting the lower electrode; a dielectric film surrounding the lower electrode and the insulating support pattern; a high-k interface layer, wherein the high-k interface layer is arranged between the lower electrode and the dielectric film and between the insulating support pattern and the dielectric film, and wherein the high-k interface layer contacts the insulating support pattern and includes a zirconium oxide layer; and an upper electrode disposed adjacent to the lower electrode, wherein the high-k interface layer and the dielectric film are disposed between the upper electrode and the lower electrode.

An integrated circuit device according to another aspect of the inventive concept includes: a substrate including an active region; a conductive region disposed on the active region; a capacitor disposed on the conductive region; and an insulating support pattern supporting a portion of the capacitor, wherein the capacitor includes: a lower electrode including a portion contacting the insulating support pattern; a dielectric film at least partially surrounding the lower electrode and the insulating support pattern; a high-k interface layer arranged between the lower electrode and the dielectric film and between the insulating support pattern and the dielectric film, and wherein the high-k interface layer contacts the insulating support pattern, and includes a zirconium oxide layer; and an upper electrode disposed adjacent the lower electrode, wherein the high-k interface layer and the dielectric film are disposed between the upper electrode and the lower electrode.

An integrated circuit device according to another aspect of the inventive concept includes: a substrate including an active region; a plurality of conductive regions disposed on the active region; an insulating pattern disposed on the plurality of conductive regions and extending in a horizontal direction parallel to the substrate, the insulating pattern including a plurality of openings that vertically overlap the plurality of conductive regions; a plurality of lower electrodes penetrating the insulating pattern through the plurality of openings and connected to the plurality of conductive regions, wherein each of the plurality of lower electrodes includes a first metal; an insulating support pattern disposed apart from the insulating pattern in a vertical direction to extend in the horizontal direction, the insulating support pattern contacting a portion of each of the plurality of lower electrodes to support the plurality of lower electrodes; a dielectric film covering the plurality of lower electrodes, the insulating pattern, and the insulating support pattern; a high-k interface layer arranged between the plurality of lower electrodes and the dielectric film, between the insulating support pattern and the dielectric film, and between the insulating pattern and the dielectric film, wherein the high-k interface layer contacts the insulating support pattern, and includes a zirconium oxide layer; and an upper electrode disposed adjacent to each of the plurality of lower electrodes, wherein the high-k interface layer and the dielectric film are disposed between the upper electrode and each of the plurality of lower electrodes, and wherein the upper electrode includes a second metal.

BRIEF DESCRIPTION OF THE DRAWINGS

Embodiments of the inventive concept will be more clearly understood from the following detailed description taken in conjunction with the accompanying drawings, in which.

DETAILED DESCRIPTION OF THE EMBODIMENTS

Figure 1:
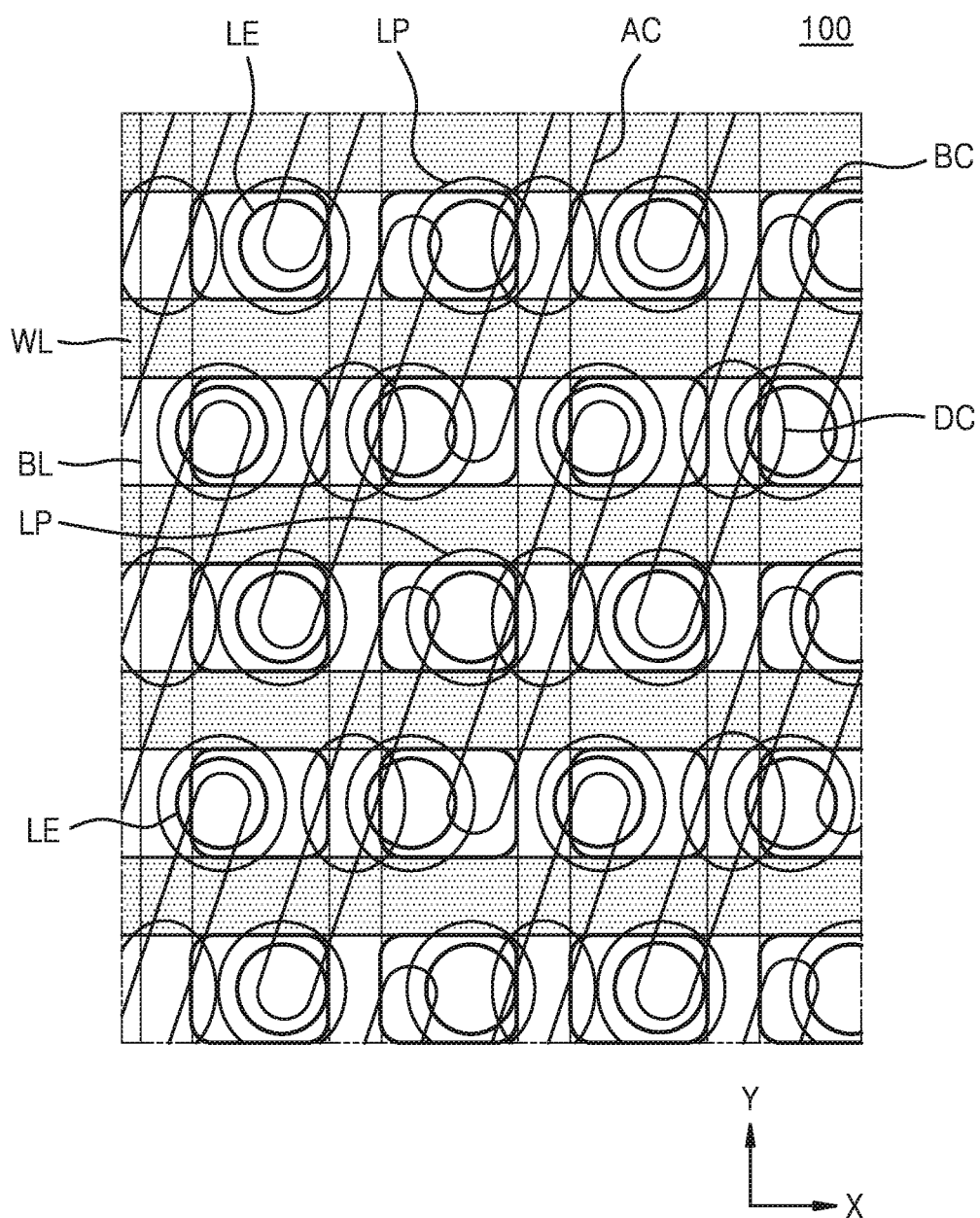
FIG. 1 is a schematic planar layout that illustrates some components in a memory cell array area of an integrated circuit device, according to embodiments of the inventive concept.

Hereinafter, embodiments of the inventive concept will be described in detail with reference to the accompanying drawings. Like components are denoted by like reference numerals throughout the specification, and to the extent any description is omitted, it will be appreciated that description of similar components may be found throughout in the specification.

FIG. 1 is a schematic planar layout that illustrates some components in a memory cell array area of an integrated circuit device, according to embodiments of the inventive concept.

Referring to FIG. 1, an integrated circuit device 100 may include a plurality of active regions AC which extend in an oblique direction on a horizontal plane with respect to a first horizontal direction (e.g., an X direction) and a second horizontal direction (e.g., a Y direction), which are perpendicular to each other on the horizontal plane. A plurality of word lines WL may extend parallel to each other in the first horizontal direction (e.g., the X direction) across the plurality of active regions AC. A plurality of bit lines BL may be arranged over the plurality of word lines WL and extend parallel to each other in the second horizontal direction (e.g., the Y direction). Each of the plurality of bit lines BL may be connected to an active region AC via a direct contact DC.

A plurality of buried contacts BC may be formed between two adjacent bit lines BL from among the plurality of bit lines BL. A plurality of conductive landing pads LP may be respectively formed on the plurality of buried contacts BC. Each of the plurality of conductive landing pads LP may at least partially overlap a buried contact BC. A plurality of lower electrodes LE may be respectively formed on the plurality of conductive landing pads LP. The plurality of lower electrodes LE may be spaced apart from each other. The plurality of lower electrodes LE may be respectively connected to the plurality of active regions AC via the plurality of buried contacts BC and the plurality of conductive landing pads LP.

Figure 2A:
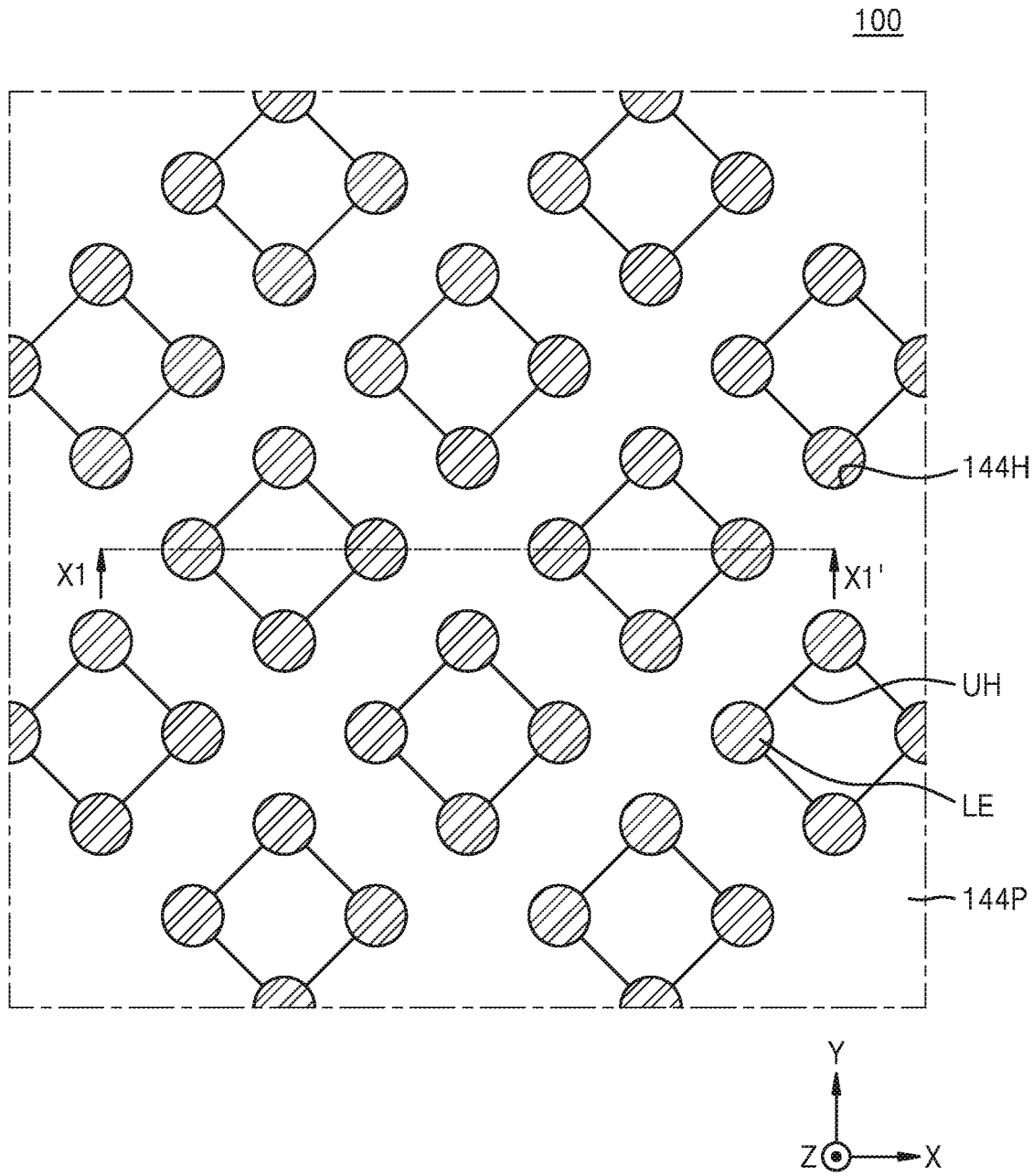
FIG. 2A is a plan view that illustrates some components of the integrated circuit device shown in FIG. 1.
Figure 2B:
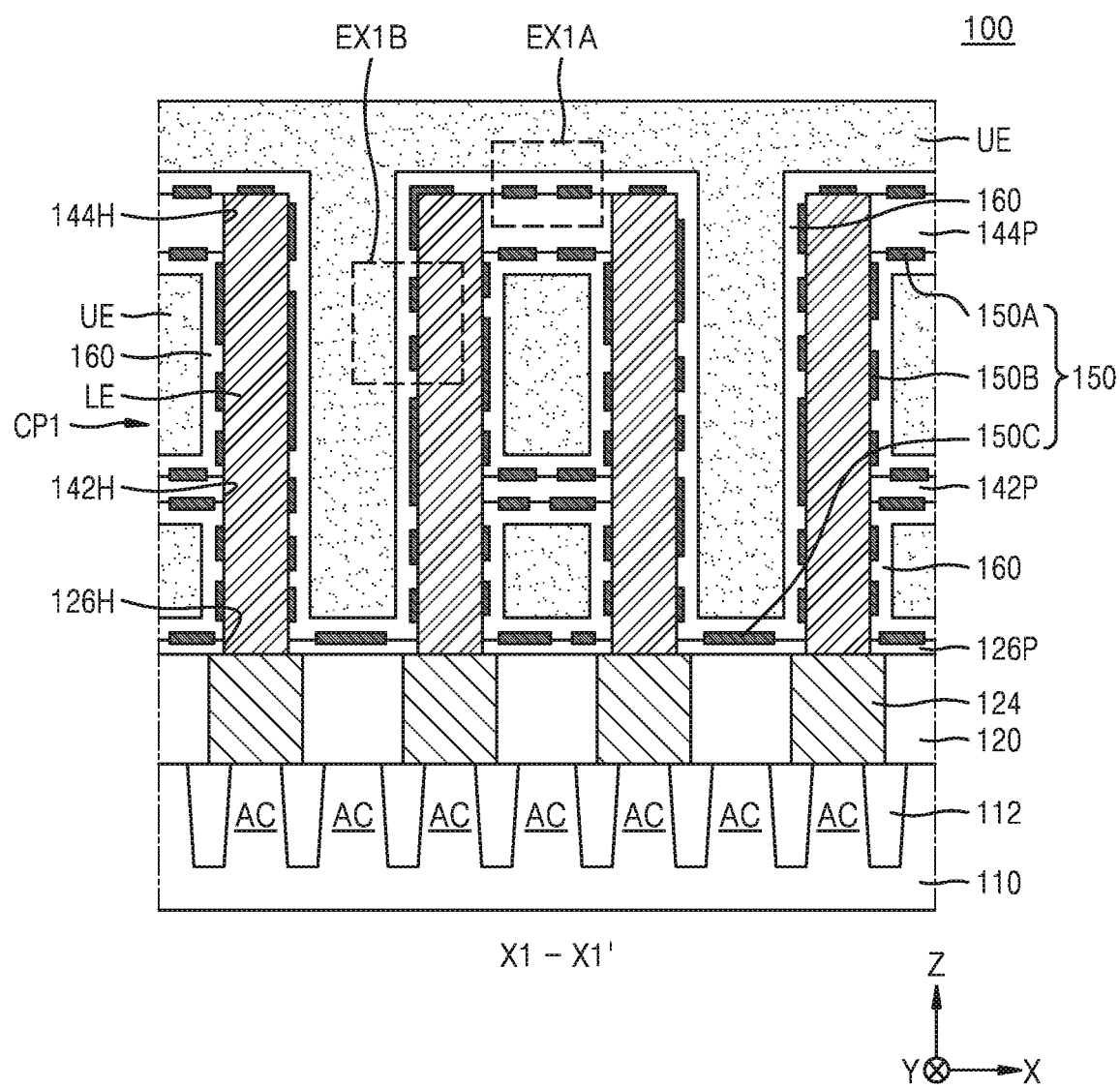
FIG. 2B is a cross-sectional view that schematically illustrates some components, taken along a line X1-X1' of FIG. 2A.
Figure 3:
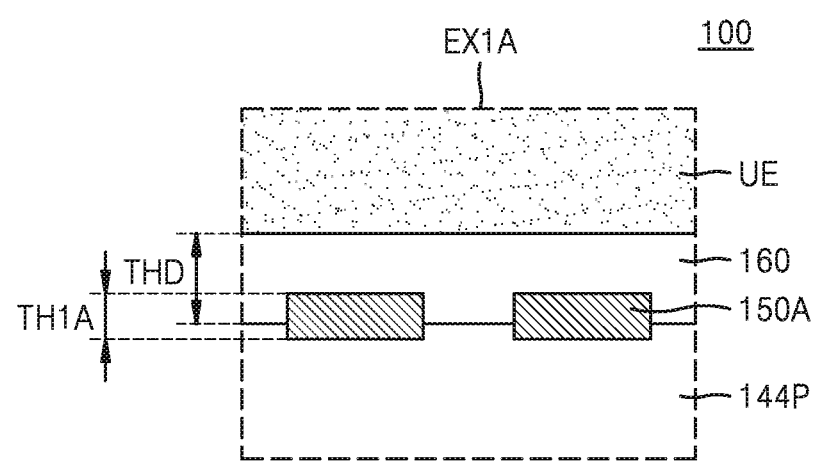
FIG. 3 is an enlarged cross-sectional view of a region EX1A in FIG. 2B.
Figure 4:
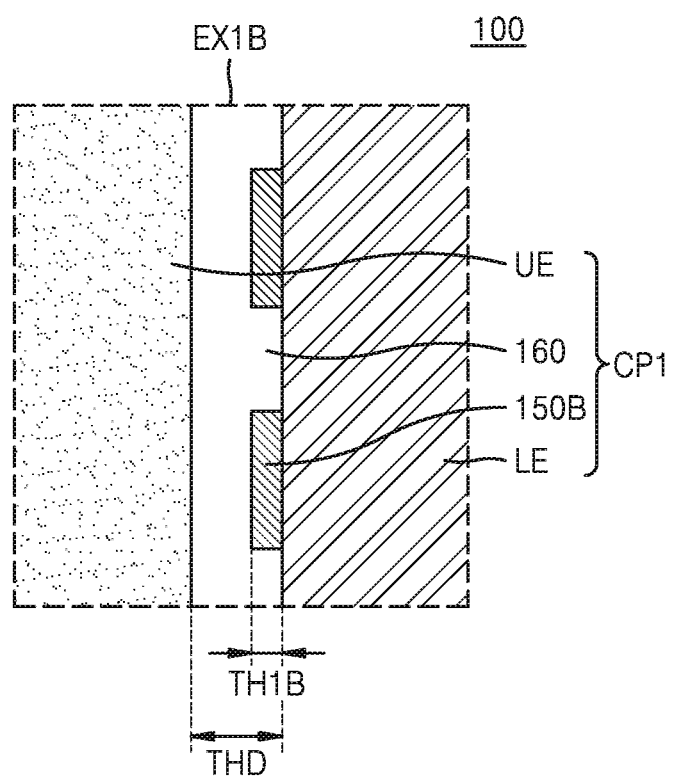
FIG. 4 is an enlarged cross-sectional view of a region EX1B in FIG. 2B.

FIG. 2A is a plan view that illustrates some components of the integrated circuit device 100 shown in FIG. 1. FIG. 2B is a schematic cross-sectional view that illustrates some components of the integrated circuit device 100, taken along a line X1-X1' of FIG. 2A. FIG. 3 is an enlarged cross-sectional view of a region EX1A in FIG. 2B. FIG. 4 is an enlarged cross-sectional view of a region EX1B in FIG. 2B.

Referring to FIGS. 2A, 2B, 3, and 4, the integrated circuit device 100 may include a substrate 110 including the plurality of active regions AC, and a lower structure 120 disposed on the substrate 110. A plurality of conductive regions 124 may be respectively connected to the plurality of active regions AC through the lower structure 120 in a vertical direction (Z direction).

The substrate 110 may include an elemental semiconductor such as Si or Ge, or a compound semiconductor such as SiC, GaAs, InAs, or InP. The substrate 110 may include a semiconductor substrate, and structures including at least one insulating film and/or at least one conductive region, which is formed on the semiconductor substrate. The conductive region may include, for example, an impurity-doped well or an impurity-doped structure. A device isolation film 112, which defines the plurality of active regions AC, may be formed in the substrate 110. The device isolation film 112 may include an oxide film, a nitride film, or a combination thereof.

In some embodiments, the lower structure 120 may include an insulating film including a silicon oxide film, a silicon nitride film, or a combination thereof. In some embodiments, the lower structure 120 may include various conductive regions, such as a wiring layer, a contact plug, a transistor, and the like, and insulating films that insulate the conductive regions from each other. The plurality of conductive regions 124 may each include polysilicon, a metal, a conductive metal nitride, a metal silicide, or a combination thereof. The lower structure 120 may include the plurality of bit lines BL described with reference to FIG. 1. Each of the plurality of conductive regions 124 may include the buried contact BC and the conductive landing pad LP, which are described with reference to FIG. 1.

An insulating pattern 126P having a plurality of openings 126H may be arranged on the lower structure 120 and the plurality of conductive regions 124. The plurality of openings 126H may respectively overlap the plurality of conductive regions 124 in the vertical direction (Z direction). The insulating pattern 126P may include a silicon nitride (SiN) film, a silicon carbonitride (SiCN) film, a silicon boron nitride (SiBN) film, or a combination thereof. As used herein, each of the terms "SiN", "SiCN", and "SiBN" refer to a material that is composed of elements included in each of the terms, and is not a chemical formula representing a stoichiometric relationship.

A plurality of capacitors CP1 may be respectively arranged on the plurality of conductive regions 124. Each of the plurality of capacitors CP1 may include a lower electrode LE, a high-k interface layer 150 and a dielectric film 160 which are both sequentially stacked on the lower electrode LE in the stated order, and an upper electrode UE which covers the dielectric film 160. The plurality of lower electrodes LE may face the upper electrode UE with the high-k interface layer 150 and the dielectric film 160 therebetween. For example, there may be two lower electrodes LE adjacent to an upper electrode UE disposed between them. As used herein, the term "high-k interface layer" may refer to a layer having a dielectric constant that is greater than a dielectric constant of the dielectric film 160. The dielectric constant of the high-k interface layer 150 may be greater than the dielectric constant of the dielectric film 160.

The insulating pattern 126P may be arranged adjacent to a lower end of each of the plurality of lower electrodes LE. For example, the lower end of each of the plurality of lower electrodes LE may be the end of the lower electrode LE that is proximal to the lower structure 120. Each of the plurality of lower electrodes LE may have a pillar shape extending lengthwise in a direction, which is orthogonal to the substrate 110 in the vertical direction (Z direction), through an opening 126H of the insulating pattern 126P from a top surface of a conductive region 124. Although FIG. 2B illustrates an example in which each of the plurality of lower electrodes LE has a pillar shape, the inventive concept is not limited thereto. For example, each of the plurality of lower electrodes LE may have a cross-sectional structure having a cup shape or a closed-bottom cylinder shape.

The integrated circuit device 100 may include a lower insulating support pattern 142P and an upper insulating support pattern 144P, which support the plurality of lower electrodes LE.

FIG. 2A illustrates a planar structure of each of the upper insulating support pattern 144P and the plurality of lower electrodes LE. As shown in FIGS. 2A and 2B, the upper insulating support pattern 144P may extend in a direction parallel to the substrate 110 and may at least partially surround an upper end of each of the plurality of lower electrodes LE while being spaced apart from the insulating pattern 126P in the vertical direction (Z direction). A plurality of holes 144H, through which the plurality of lower electrodes LE are disposed, may be formed in the upper insulating support pattern 144P. An inner sidewall of each of the plurality of holes 144H formed in the upper insulating support pattern 144P may contact an outer sidewall of the lower electrode LE. A top surface of each of the plurality of lower electrodes LE may be coplanar with a top surface of the upper insulating support pattern 144P.

As shown in FIG. 2B, the lower insulating support pattern 142P may be arranged between the substrate 110 and the upper insulating support pattern 144P and may extend horizontally and parallel to the substrate 110, and may contact sidewalls of the plurality of lower electrode LE. A plurality of holes 142H, through which the plurality of lower electrodes LE are disposed, may be formed in the lower insulating support pattern 142P. The plurality of lower electrodes LE may extend lengthwise in the vertical direction (Z direction) through the plurality of holes 144H, which are formed in the upper insulating support pattern 144P, and the plurality of holes 142H, which are formed in the lower insulating support pattern 142P.

As shown in FIG. 2A, a plurality of upper holes UH may be formed in the upper insulating support pattern 144P. FIG. 2A illustrates a configuration in which a planar shape of each of the plurality of upper holes UH is approximately a rhombic shape where four adjacent lower electrodes LE correspond to vertices of the shape. However, the planar shape of each of the plurality of upper holes UH is not limited to the example of FIG. 2A, and various changes and modifications may be made therein without departing from the spirit and scope of the inventive concept. A plurality of lower holes LH (see FIG. 9E), each having a planar shape corresponding to the planar shape of each of the plurality of upper holes UH, may be formed in the lower insulating support pattern 142P.

Each of the lower insulating support pattern 142P and the upper insulating support pattern 144P may include a silicon nitride (SiN) film, a silicon carbonitride (SiCN) film, a silicon boron nitride (SiBN) film, or a combination thereof. In example embodiments, the lower insulating support pattern 142P and the upper insulating support pattern 144P may include the same materials as each other. In other example embodiments, the lower insulating support pattern 142P and the upper insulating support pattern 144P may include different materials from each other. In one example, each of the lower insulating support pattern 142P and the upper insulating support pattern 144P may include SiCN. In another example, the lower insulating support pattern 142P may include SiCN, and the upper insulating support pattern 144P may include SiBN. However, the inventive concept is not limited to the materials set forth above, which are examples.

The high-k interface layer 150, the dielectric film 160, and the upper electrode UE may be sequentially stacked on each of the plurality of lower electrodes LE, the lower insulating support pattern 142P, the upper insulating support pattern 144P, and the insulating pattern 126P. For example, high-k interface layer 150, the dielectric film 160, and the upper electrode UE may be sequentially stacked in the above stated order, as illustrated in FIG. 2B.

The high-k interface layer 150 may include a first interface portion 150A arranged between the lower insulating support pattern 142P and the dielectric film 160 and between the upper insulating support pattern 144P and the dielectric film 160, a second interface portion 150B arranged between the lower electrode LE and the dielectric film 160, and a third interface portion 150C arranged between the insulating pattern 126P and the dielectric film 160.

The first interface portion 150A of the high-k interface layer 150 may contact each of the lower insulating support pattern 142P, the upper insulating support pattern 144P, and the dielectric film 160. The second interface portion 150B of the high-k interface layer 150 may contact the lower electrode LE and the dielectric film 160. The third interface portion 150C of the high-k interface layer 150 may contact the insulating pattern 126P and the dielectric film 160.

Each of the first interface portion 150A, the second interface portion 150B, and the third interface portion 150C of the high-k interface layer 150 may include a plurality of interface clusters having a plurality of island shapes which are spaced apart from each other.

Figure 5A:
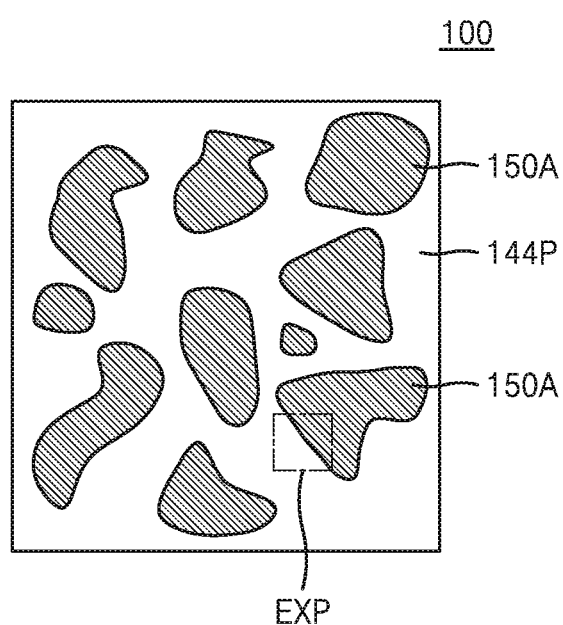
FIG. 5A is a plan view that illustrates a planar shape of a high-k interface layer included in an integrated circuit device, according to embodiments of the inventive concept.

FIG. 5A is a plan view that illustrates a planar shape of the high-k interface layer 150. FIG. 5A illustrates a plan view of some regions of the first interface portion 150A of the high-k interface layer 150, including regions covering the upper insulating support pattern 144P.

As shown in FIG. 5A, the first interface portion 150A of the high-k interface layer 150 may have a planar structure having a plurality of island shapes. Similar to the first interface portion 150A shown in FIG. 5A, the second interface portion 150B and the third interface portion 150C of the high-k interface layer 150 may each also have a planar structure having a plurality of island shapes.

Figure 5B:
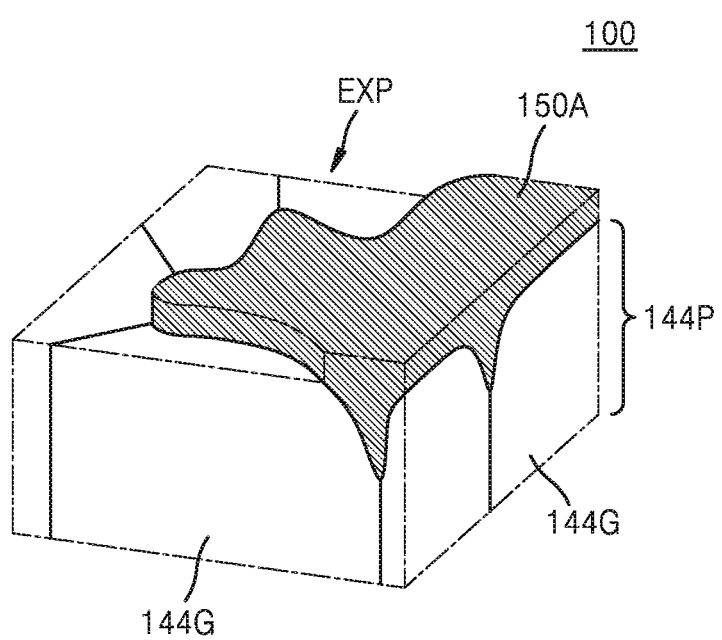
FIG. 5B is an enlarged partially-cutaway perspective view of a portion of a region EXP in FIG. 5A.

FIG. 5B is an enlarged partially-cutaway perspective view of some area included in a region EXP in FIG. 5A.

As shown in FIG. 5B, the upper insulating support pattern 144P may be formed by a chemical vapor deposition (CVD) process. The upper insulating support pattern 144P formed by the CVD process may include a plurality of insulating grains 144G. The upper insulating support pattern 144P formed by the CVD process may have a relatively less dense structure than a film formed by an atomic layer deposition (ALD) process.

The first interface portion 150A covering the upper insulating support pattern 144P may include a portion that at least partially covers a top surface of the upper insulating support pattern 144P, and a portion that permeates into the upper insulating support pattern 144P through grain boundaries between each of the plurality of insulating grains 144G included in the upper insulating support pattern 144P. Accordingly, as shown in FIG. 3, a portion of the first interface portion 150A covering the upper insulating support pattern 144P may protrude toward the dielectric film 160 from an interface between the upper insulating support pattern 144P and the dielectric film 160, and another portion of the first interface portion 150A covering the upper insulating support pattern 144P may protrude into the upper insulating support pattern 144P from the interface between the upper insulating support pattern 144P and the dielectric film 160. Although FIG. 3 illustrates an example case in which the portion of the first interface portion 150A, which protrudes into the upper insulating support pattern 144P, has a flat bottom surface, this is merely for the convenience of illustration, and a cross-sectional shape of the first interface portion 150A is not limited to the example shown in FIG. 3.

For example, as shown in FIG. 5B, the portion of the first interface portion 150A, which protrudes into the upper insulating support pattern 144P, may have an irregular shape and an irregular size, and thus, the roughness of a surface of the first interface portion 150A, which faces the upper insulating support pattern 144P, may be greater than the roughness of a surface of the first interface portion 150A, which faces the dielectric film 160. For example, there may be a greater variation in heights and protrusions on the side of the first interface portion 150A that faces the upper insulating support pattern than the side that faces the dielectric film 160.

Each of the lower insulating support pattern 142P and the insulating pattern 126P may be obtained by a CVD process. Similar to the descriptions made regarding the upper insulating support pattern 144P with reference to FIG. 5B, each of the lower insulating support pattern 142P and the insulating pattern 126P may include a plurality of insulating grains. Accordingly, the first interface portion 150A of the high-k interface layer 150, which at least partially covers the lower insulating support pattern 142P, and the third interface portion 150C of the high-k interface layer 150, which at least partially covers the insulating pattern 126P, may each have a shape that is the same as or similar to that of the first interface portion 150A of the high-k interface layer 150, which at least partially covers the upper insulating support pattern 144P, as described with reference to FIGS. 5A and 5B.

The plurality of lower electrodes LE may be formed by an ALD process. Accordingly, each of the plurality of lower electrodes LE may have a more dense structure than the lower insulating support pattern 142P, the upper insulating support pattern 144P, and the insulating pattern 126P, and the roughness of surfaces of the plurality of lower electrodes LE, which face the dielectric film 160, may be less than the roughness of respective surfaces of the lower insulating support pattern 142P, the upper insulating support pattern 144P, and the insulating pattern 126P, which face the dielectric film 160. Therefore, the second interface portion 150B covering a surface of each of the plurality of lower electrodes LE may not include a portion protruding into the lower electrode LE.

As described above, the shape of the first interface portion 150A of the high-k interface layer 150, which at least partially covers the lower insulating support pattern 142P and the upper insulating support pattern 144P, and the shape of the third interface portion 150C of the high-k interface layer 150, which at least partially covers the insulating pattern 126P, may be different from the shape of the second interface portion 150B of the high-k interface layer 150, which at least partially covers the plurality of lower electrodes LE, and a thickness of each of the first interface portion 150A and the third interface portion 150C may be different from a thickness of the second interface portion 150B.

The high-k interface layer 150 may have a thickness between about 0 nm and about 2 nm. For example, the high-k interface layer 150 may have a thickness between about 0 nm and about 1 nm. In example embodiments, the thicknesses of each of the first interface portion 150A and the third interface portion 150C may be greater than the thickness of the second interface portion 150B. For example, as shown in FIGS. 3 and 4, a thickness TH1A of the first interface portion 150A may be greater than a thickness TH1B of the second interface portion 150B. The thickness TH1A of the first interface portion 150A and the thickness TH1B of the second interface portion 150B may be less than a thickness THD of the dielectric film 160.

As shown in FIG. 2B, the dielectric film 160 may contact the lower insulating support pattern 142P and the upper insulating support pattern 144P through spaces between each of the plurality of interface clusters constituting the first interface portion 150A, may contact the lower electrode LE through spaces between each of the plurality of interface clusters constituting the second interface portion 150B, and may contact the insulating pattern 126P through spaces between each of the plurality of interface clusters constituting the third interface portion 150C.

The high-k interface layer 150 might not be disposed between the lower electrode LE and the insulating pattern 126P, between the lower electrode LE and the lower insulating support pattern 142P, and between the lower electrode LE and the upper insulating support pattern 144P.

The high-k interface layer 150 may include a material having a relatively broad band gap energy of about 5 eV or more. In example embodiments, the high-k interface layer 150 may include a zirconium oxide layer. For example, the high-k interface layer 150 may include a portion including $ZrO_2$.

In some example embodiments, the high-k interface layer 150 may include a zirconium oxide layer including at least one dopant element. The at least one dopant element may include a metallic element that is different from zirconium (Zr). The at least one dopant element may include a typical metal, a transition metal, or a post-transition metal.

In example embodiments, the high-k interface layer 150 may include a zirconium oxide layer including at least one dopant element selected from among aluminum (Al), niobium (Nb), molybdenum (Mo), ruthenium (Ru), indium (In), tin (Sn), antimony (Sb), scandium (Sc), titanium (Ti), vanadium (V), manganese (Mn), iron (Fe), cobalt (Co), nickel (Ni), arsenic (As), tantalum (Ta), tungsten (W), iridium (Jr), yttrium (Y), and bismuth (Bi). For example, the high-k interface layer 150 may include a zirconium oxide layer doped with Ti, a zirconium oxide layer doped with Nb, a zirconium oxide layer doped with Ti and Nb, or a combination thereof.

The high-k interface layer 150 may include a stoichiometric metallic oxide layer or a non-stoichiometric metallic oxide layer. For example, the high-k interface layer 150 may include a $ZrO_2$ layer, an oxygen-deficient zirconium oxide layer having a lower oxygen atom content proportion than the $ZrO_2$ layer, or an oxygen-rich zirconium oxide layer having a greater oxygen atom content proportion than the $ZrO_2$ layer. Each of the $ZrO_2$ layer, the oxygen-deficient zirconium oxide layer, and the oxygen-rich zirconium oxide layer may further include at least one dopant element including a metallic element that is different from zirconium (Zr), or may not include the dopant element set forth above.

The dielectric film 160 may include a high-k film. As used herein, the term "high-k film" refers to a dielectric film having a higher dielectric constant than a silicon oxide film. In example embodiments, the dielectric film 160 may include a metal oxide including at least one metal selected from among hafnium (Hf), zirconium (Zr), aluminum (Al), niobium (Nb), cerium (Ce), lanthanum (La), tantalum (Ta), and titanium (Ti). In example embodiments, the dielectric film 160 may have a single-layer structure including one type of high-k film. In some example embodiments, the dielectric film 160 may have a multi-layer structure including a plurality of types of high-k films. The high-k film may include, but is not limited to, $HfO_2$, $ZrO_2$, $Al_2O_3$, $La_2O_3$, $Ta_2O_3$, $Nb_2O_5$, $CeO_2$, $TiO_2$, $GeO_2$, or a combination thereof. In example embodiments, the thickness THD (see FIGS. 3 and 4) of the dielectric film 160 may be, but is not limited to, about 2 nm to about 8 nm.

The lower electrode LE may include a first metal. The upper electrode UE may include a second metal. In example embodiments, the second metal may be the same as the first metal. In other example embodiments, the second metal may be different from the first metal.

The lower electrode LE and the upper electrode UE may each include a metal film, a conductive metal oxide film, a conductive metal nitride film, a conductive metal oxynitride film, or a combination thereof. In example embodiments, the lower electrode LE and the upper electrode UE may each include Nb, Nb oxide, Nb nitride, Nb oxynitride, Ti, Ti oxide, Ti nitride, Ti oxynitride, Co, Co oxide, Co nitride, Co oxynitride, Sn, Sn oxide, Sn nitride, Sn oxynitride, or a combination thereof. For example, the lower electrode LE and the upper electrode UE may each include NbN, TiN, CoN, $SnO_2$, or a combination thereof. In other example embodiments, the lower electrode LE and the upper electrode UE may each include TaN, TiAlN, TaAlN, V, VN, Mo, MoN, W, WN, Ru, $RuO_2$, $SrRuO_3$, Ir, $IrO_2$, Pt, PtO, SRO ($SrRuO_3$), BSRO (($Ba,Sr)RuO_3$), CRO ($CaRuO_3$), LSCO (($La,Sr)CoO_3$), or a combination thereof. However, the material of each of the lower electrode LE and the upper electrode UE is not limited to the examples set forth above.

In example embodiments, the lower electrode LE may include a first metallic element, the dielectric film 160 may include a second metallic element that is different from the first metallic element, and the high-k interface layer 150 may include a dopant element including the same metallic element as the first metallic element and/or the second metallic element. In one example, the lower electrode LE may include Ti, Ti oxide, Ti nitride, Ti oxynitride, or a combination thereof, and the high-k interface layer 150 may include a zirconium oxide layer doped with Ti or a zirconium oxide layer doped with Ti and Nb. In another example, the lower electrode LE may include Nb, Nb oxide, Nb nitride, Nb oxynitride, or a combination thereof, and the high-k interface layer 150 may include a zirconium oxide layer doped with Nb or a zirconium oxide layer doped with Ti and Nb.

In some example embodiments, the lower electrode LE may include a first metallic element, the dielectric film 160 may include a second metallic element that is different from the first metallic element, and the high-k interface layer 150 may include at least one dopant element including a metallic element that is different from the first metallic element and the second metallic element. In one example, the lower electrode LE may include Co, Co oxide, Co nitride, Co oxynitride, Sn, Sn oxide, Sn nitride, Sn oxynitride, or a combination thereof, and the high-k interface layer 150 may include a zirconium oxide layer doped with Ti or a zirconium oxide layer doped with Ti and Nb.

In other example embodiments, the integrated circuit device 100 may further include an upper conductive interface layer arranged between the dielectric film 160 and the upper electrode UE. The upper conductive interface layer may include, but is not limited to, a $TiO_2$ layer.

Figure 6:
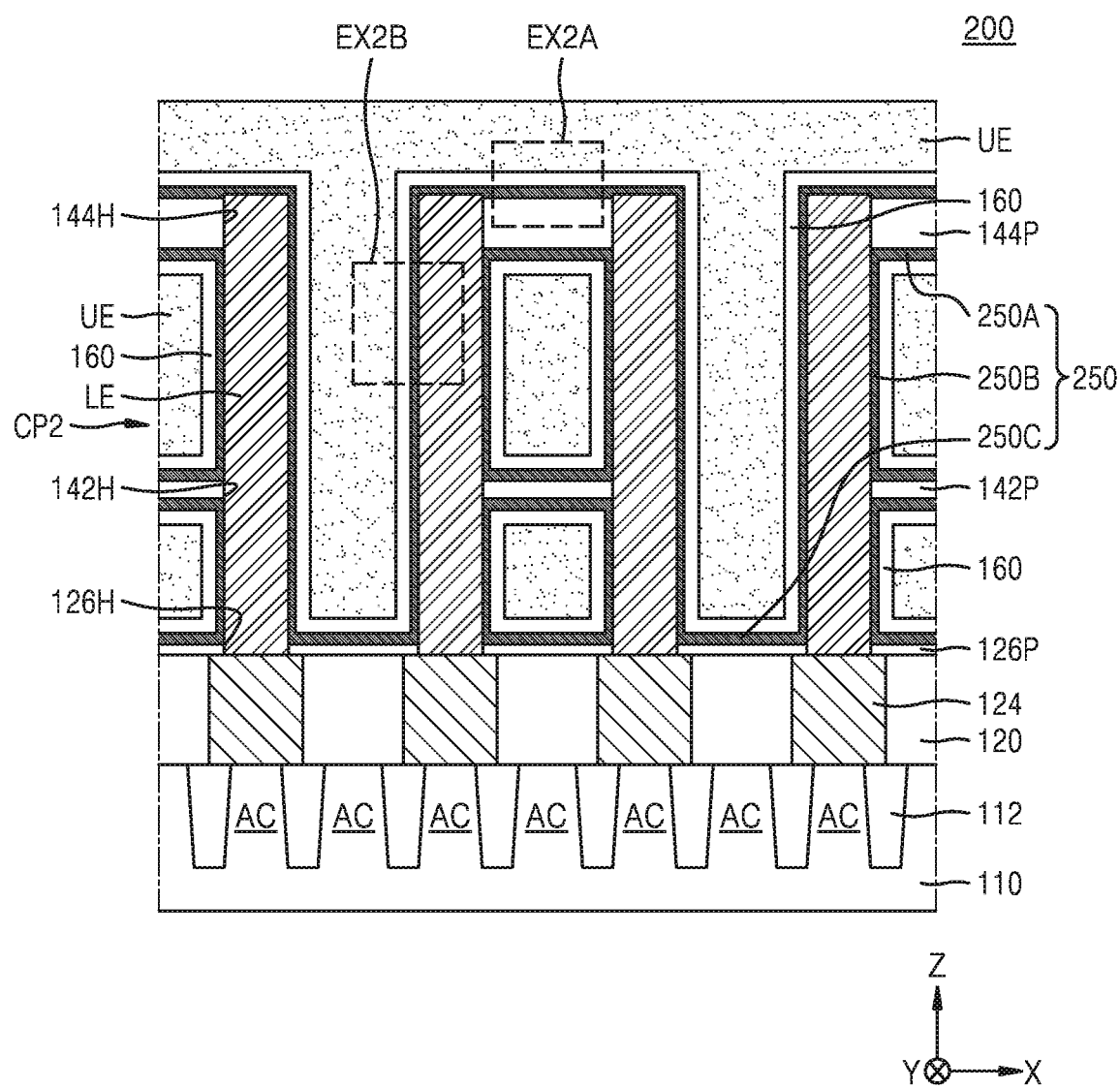
FIG. 6 is a cross-sectional view that illustrates main components of an integrated circuit device, according to embodiments of the inventive concept.
Figure 7:
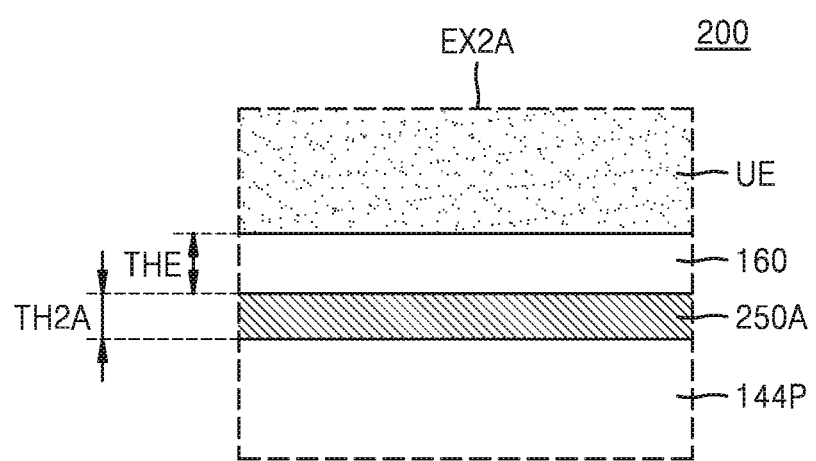
FIG. 7 is an enlarged cross-sectional view of a region EX2A in FIG. 6.
Figure 8:
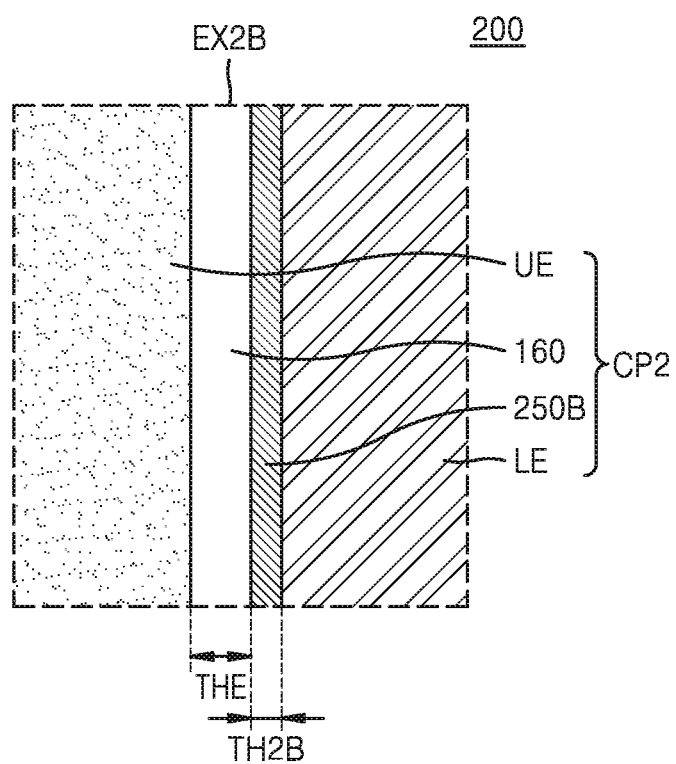
FIG. 8 is an enlarged cross-sectional view of a region EX2B in FIG. 6.

FIG. 6 is a cross-sectional view that illustrates main components of an integrated circuit device 200, according to embodiments of the inventive concept. FIG. 6 schematically illustrates some components corresponding to a cross-sectional taken along the line X1-X1' of FIG. 2A. FIG. 7 is an enlarged cross-sectional view of a region EX2A in FIG. 6. FIG. 8 is an enlarged cross-sectional view of a region EX2B in FIG. 6. In FIGS. 6 to 8, the same reference numerals as in FIGS. 1 to 4 denote the same members, and here, repeated detailed descriptions thereof may be omitted for brevity.

Referring to FIGS. 6 to 8, the integrated circuit device 200 may have a substantially the same configuration as the integrated circuit device 100 described with reference to FIGS. 1 to 5B. However, the integrated circuit device 200 may include a high-k interface layer 250 instead of the high-k interface layer 150. For example, the high-k interface layer 250 may be implemented without the irregular portions of the high-k interface layer 150.

The high-k interface layer 250 may have substantially the same configuration as the high-k interface layer 150 described with reference to FIGS. 2B, 3, 4, 5A, and 5B. The high-k interface layer 250 may include a first interface portion 250A arranged between the lower insulating support pattern 142P and the dielectric film 160, and arranged between the upper insulating support pattern 144P and the dielectric film 160, a second interface portion 250B arranged between the lower electrode LE and the dielectric film 160, and a third interface portion 250C arranged between the insulating pattern 126P and the dielectric film 160.

The high-k interface layer 250 may conformally cover (e.g., at least partially cover) a surface of each of the lower electrode LE, the lower insulating support pattern 142P, the upper insulating support pattern 144P, and the insulating pattern 126P. The high-k interface layer 250 may contact each of the lower electrode LE, the lower insulating support pattern 142P, the upper insulating support pattern 144P, and the insulating pattern 126P. The first interface portion 250A of the high-k interface layer 250 may contact each of the lower insulating support pattern 142P, the upper insulating support pattern 144P, and the dielectric film 160. The second interface portion 250B of the high-k interface layer 250 may contact each of the lower electrode LE and the dielectric film 160. The third interface portion 250C of the high-k interface layer 250 may contact each of the insulating pattern 126P and the dielectric film 160.

The first interface portion 250A of the high-k interface layer 250 may extend (e.g., continuously extend) between the lower insulating support pattern 142P and the dielectric film 160 and between the upper insulating support pattern 144P and the dielectric film 160 such that the lower insulating support pattern 142P and the upper insulating support pattern 144P do not contact the dielectric film 160. The second interface portion 250B of the high-k interface layer 250 may extend (e.g., continuously extend) between the lower electrode LE and the dielectric film 160 such that the lower electrode LE and the dielectric film 160 do not contact each other. The third interface portion 250C of the high-k interface layer 250 may extend (e.g., continuously extend) between the insulating pattern 126P and the dielectric film 160 such that the insulating pattern 126P and the dielectric film 160 do not contact each other. The first interface portion 250A, the second interface portion 250B, and the third interface portion 250C of the high-k interface layer 250 may be integrally connected to each other.

The high-k interface layer 250 may have a thickness between about 0 nm and about 2 nm. For example, the high-k interface layer 250 may have a thickness that is between about 0 nm and about 1 nm. In the high-k interface layer 250, a thickness of each of the first interface portion 250A and the third interface portion 250C may be different from a thickness of the second interface portion 250B. In example embodiments, the thickness of the first interface portion 250A may be equal or similar to the thickness of the third interface portion 250C. In example embodiments, as shown in FIGS. 7 and 8, a thickness TH2A of the first interface portion 250A may be greater than a thickness TH2B of the second interface portion 250B. The thickness TH2A of the first interface portion 250A and the thickness TH2B of the second interface portion 250B may be less than a thickness THE of the dielectric film 160.

A constituting material (e.g., a main material) of the high-k interface layer 250 is the same as described regarding the constituting material of the high-k interface layer 150 with reference to FIGS. 2B, 3, 4, 5A, and 5B.

In some embodiments, the integrated circuit device 200 may further include an upper conductive interface layer disposed between the dielectric film 160 and the upper electrode UE. The upper conductive interface layer may include, but is not limited to, a $TiO_2$ layer.

In an integrated circuit device according to the present disclosure, such as the integrated circuit devices 100 and 200 described with reference to FIGS. 1 to 8, the high-k interface layer 150 or 250 is arranged between each of the lower insulating support pattern 142P, the upper insulating support pattern 144P, the insulating pattern 126P, and the lower electrode LE and the dielectric film 160 covering these components. Thus, an undesired depletion layer may be prevented from being generated in a portion of the lower electrode LE, which is adjacent to the dielectric film 160. In addition, the high-k interface layers 150 and 250 may each include a zirconium oxide layer having a relatively high value of band gap energy, and the zirconium oxide layer may contact the lower insulating support pattern 142P, the upper insulating support pattern 144P, and the insulating pattern 126P, thereby suppressing the occurrence of leakage current through a portion of the high-k interface layer 150 or 250, which at least partially covers the lower insulating support pattern 142P, the upper insulating support pattern 144P, and/or the insulating pattern 126P. Therefore, the generation of a leakage current in each of the capacitors CP1 and CP2 may be suppressed, and a minimum value of capacitance (Cmin) of each of the capacitors CP1 and CP2 and the total capacitance thereof may be increased, thereby increasing the reliability of each of the integrated circuit devices 100 and 200.

FIGS. 9A to 9I are cross-sectional views that illustrate sequential processes of a method of manufacturing an integrated circuit device, according to embodiments of the inventive concept. In FIGS. 9A to 9I, the same reference numerals as in FIGS. 1 to 4 denote the same members, and here, repeated detailed descriptions thereof may be omitted for brevity.

Figure 9A:
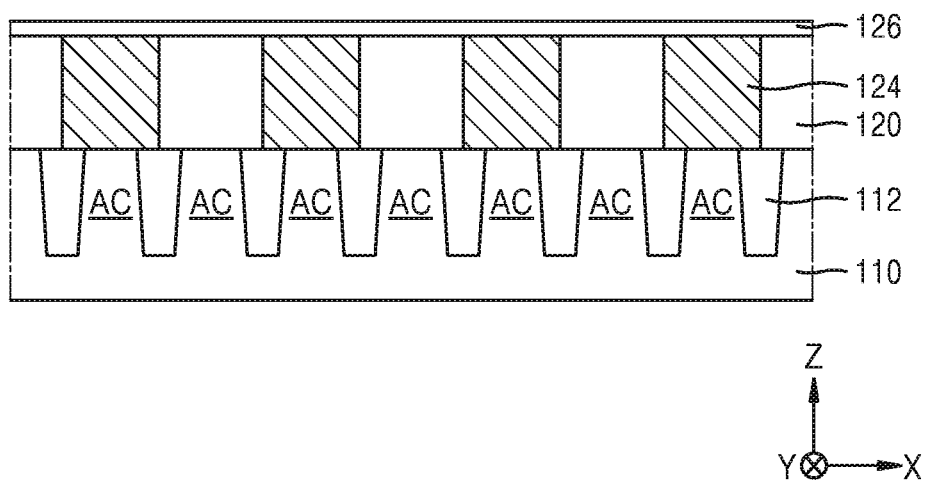
FIGS. 9A to 9I are cross-sectional views that illustrate sequential processes of a method of manufacturing an integrated circuit device, according to embodiments of the inventive concept.

Referring to FIG. 9A, the lower structure 120 and the conductive region 124 connected to the active region AC through the lower structure 120 may be formed on the substrate 110, in which the active region AC is defined by the device isolation film 212. Next, the insulating film 126 may be formed to cover the lower structure 120 and the conductive region 124.

The insulating film 126 may be used as an etch stop layer in a subsequent process. The insulating film 126 may include an insulating material having etch selectivity with respect to the lower structure 120. In example embodiments, the insulating film 126 may include a silicon nitride (SiN) film, a silicon carbonitride (SiCN) film, a silicon boron nitride (SiBN) film, or a combination thereof.

Figure 9B:
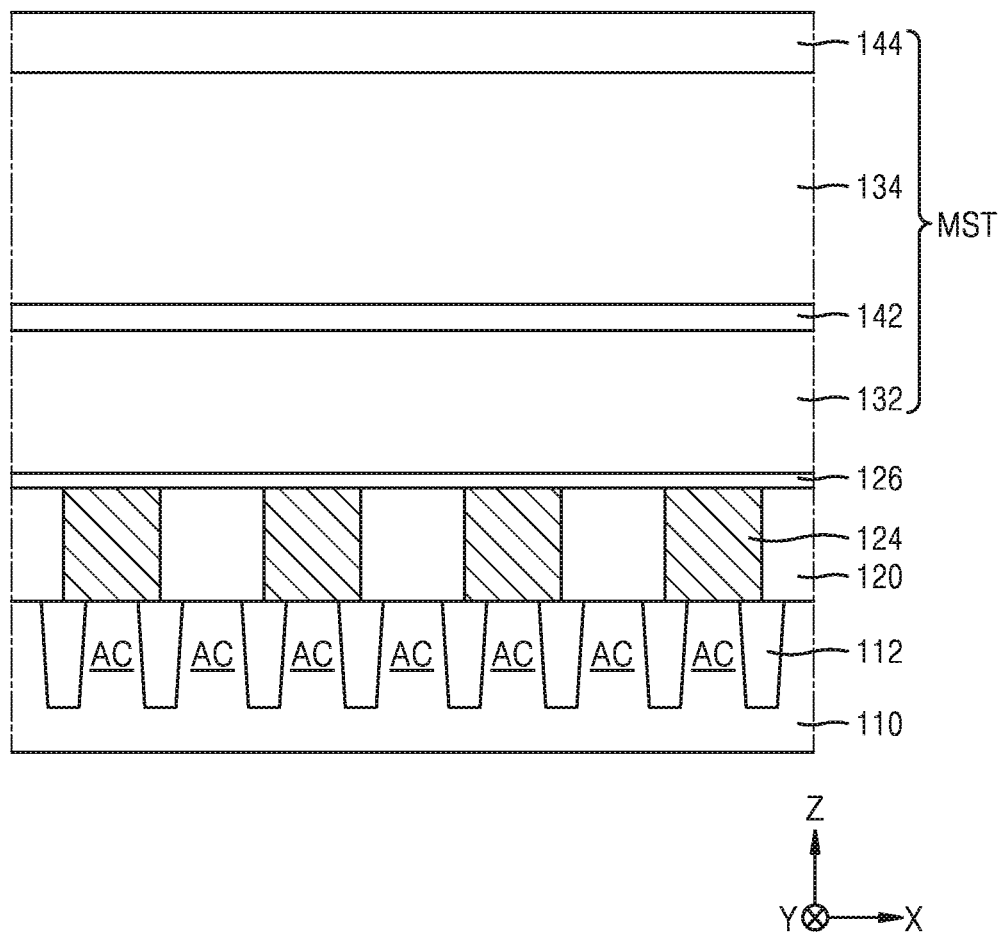

Referring to FIG. 9B, a mold structure MST may be formed on the insulating film 126.

The mold structure MST may include a plurality of mold films and a plurality of support films. For example, the mold structure MST may include a first mold film 132, a lower insulating support film 142, a second mold film 134, and an upper insulating support film 144, which are sequentially stacked on the insulating film 126 (e.g., in the stated order). Each of the first mold film 132 and the second mold film 134 may include a material which has a relatively high etch rate in an etchant including ammonium fluoride ($NH_4F$), hydrofluoric acid (HF), and water and thus is removable by a lift-off process using the etchant. In example embodiments, the first mold film 132 and the second mold film 134 may each include an oxide film, a nitride film, or a combination thereof.

For example, the first mold film 132 may include a borophosphosilicate glass (BPSG) film. The BPSG film may include a first portion, in which a concentration of a boron (B) dopant may vary in a thickness direction of the BPSG film, and/or a second portion, in which a concentration of a phosphorus (P) dopant may vary in the thickness direction of the BPSG film. The second mold film 134 may include a multi-insulating film, in which a relatively thin silicon oxide film and a relatively thin silicon nitride film are alternately stacked one by one a plurality of times, and/or a silicon nitride film. However, a constituting material of each of the first mold film 132 and the second mold film 134 is not limited to the examples set forth above, and various modifications and changes may be made therein without departing from the spirit and scope of the inventive concept. In addition, a stacking order in the mold structure MST is not limited to the example shown in FIG. 9B, and various modifications and changes may be made therein without departing from the spirit and scope of the inventive concept.

The lower insulating support film 142 and the upper insulating support film 144 may each include a silicon nitride (SiN) film, a silicon carbonitride (SiCN) film, a silicon boron nitride (SiBN) film, or a combination thereof. In example embodiments, the lower insulating support film 142 and the upper insulating support film 144 may include the same materials as each other. In some embodiments, the lower insulating support film 142 and the upper insulating support film 144 may include different materials from each other. In one example, the lower insulating support film 142 and the upper insulating support film 144 may each include a silicon carbonitride film. In another example, the lower insulating support film 142 may include a silicon carbonitride film, and the upper insulating support film 144 may include a boron-containing silicon nitride film. However, a constituting material of each of the lower insulating support film 142 and the upper insulating support film 144 is not limited to the examples set forth above, and various modifications and changes may be made therein without departing from the spirit and scope of the inventive concept.

Figure 9C:
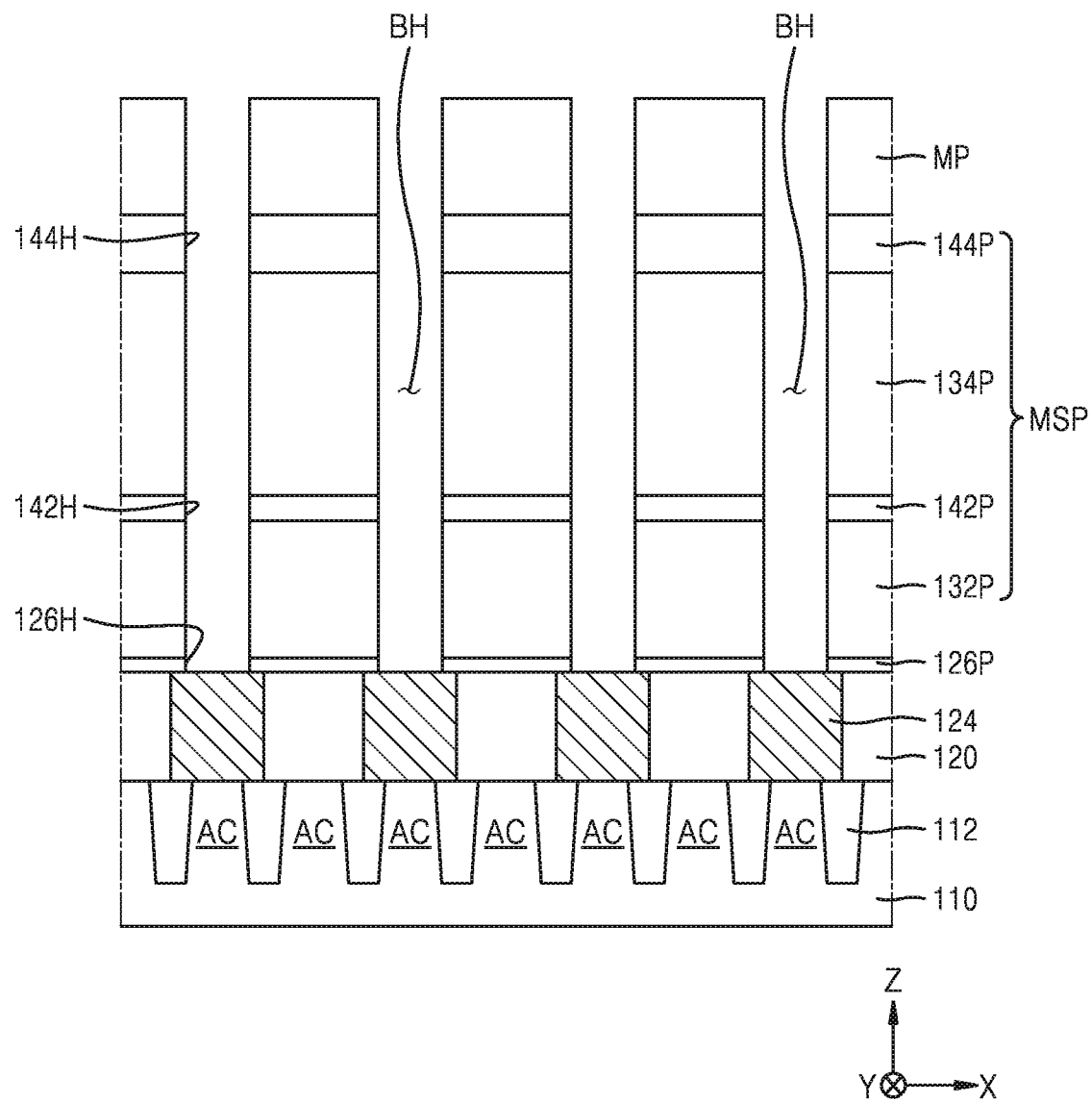

Referring to FIG. 9C, in a resulting product of FIG. 9B, a mask pattern MP may be formed on the mold structure MST, followed by anisotropically etching the mold structure MST by using the mask pattern MP as an etch mask and using the insulating film 126 as an etch stop layer, thereby forming a mold structure pattern MSP, which defines a plurality of holes BH.

The mold structure pattern MSP may include a first mold pattern 132P, the lower insulating support pattern 142P, a second mold pattern 134P, and the upper insulating support pattern 144P. The mask pattern MP may include a nitride film, an oxide film, a polysilicon film, a photoresist film, or a combination thereof.

A process of forming the plurality of holes BH may further include wet-treating a resulting product obtained by anisotropically etching the mold structure MST shown in FIG. 9B. During the processes of anisotropically etching the mold structure MST and wet-treating the resulting product thereof, the insulating film 126 may also be partially etched, thereby obtaining the insulating pattern 126P having the plurality of openings 126H, which expose the plurality of conductive regions 124. In an example process of wet-treating the resulting product obtained by anisotropically etching the mold structure MST, an etchant including a diluted sulfuric acid peroxide (DSP) solution may be used, but the inventive concept is not limited thereto.

In the mold structure pattern MSP, the plurality of holes 142H, which are portions of the plurality of holes BH, may be formed in the lower insulating support pattern 142P, and the plurality of holes 144H, which are portions of the plurality of holes BH, may be formed in the upper insulating support pattern 144P.

Figure 9D:
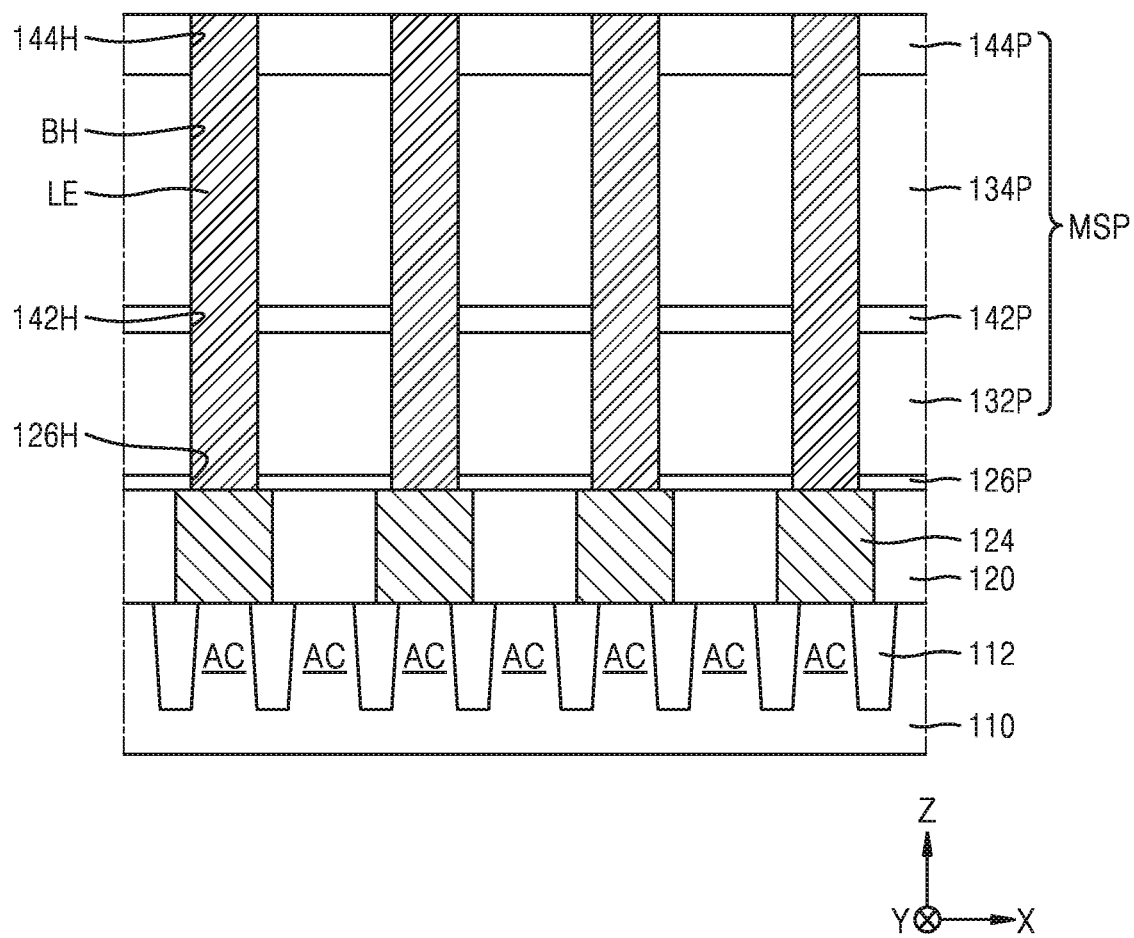

Referring to FIG. 9D, the mask pattern MP may be removed from a resulting product of FIG. 9C, and the plurality of lower electrodes LE may be formed to respectively fill the plurality of holes BH.

In example embodiments, to form the plurality of lower electrodes LE, a conductive layer may be formed in the resulting product of FIG. 9C to cover the top surface of the upper insulating support pattern 144P and to fill the plurality of holes BH. To form the conductive layer, an ALD process may be used. Next, the conductive layer may be partially removed by using an etchback process or a chemical mechanical polishing (CMP) process, thereby exposing the top surface of the upper insulating support pattern 144P.

The surface roughness of exposed surfaces of the plurality of lower electrodes LE formed by an ALD process may be less than the surface roughness of respective exposed surfaces of the lower insulating support pattern 142P, the upper insulating support pattern 144P, and the insulating pattern 126P, which are formed by CVD processes.

Figure 9E:
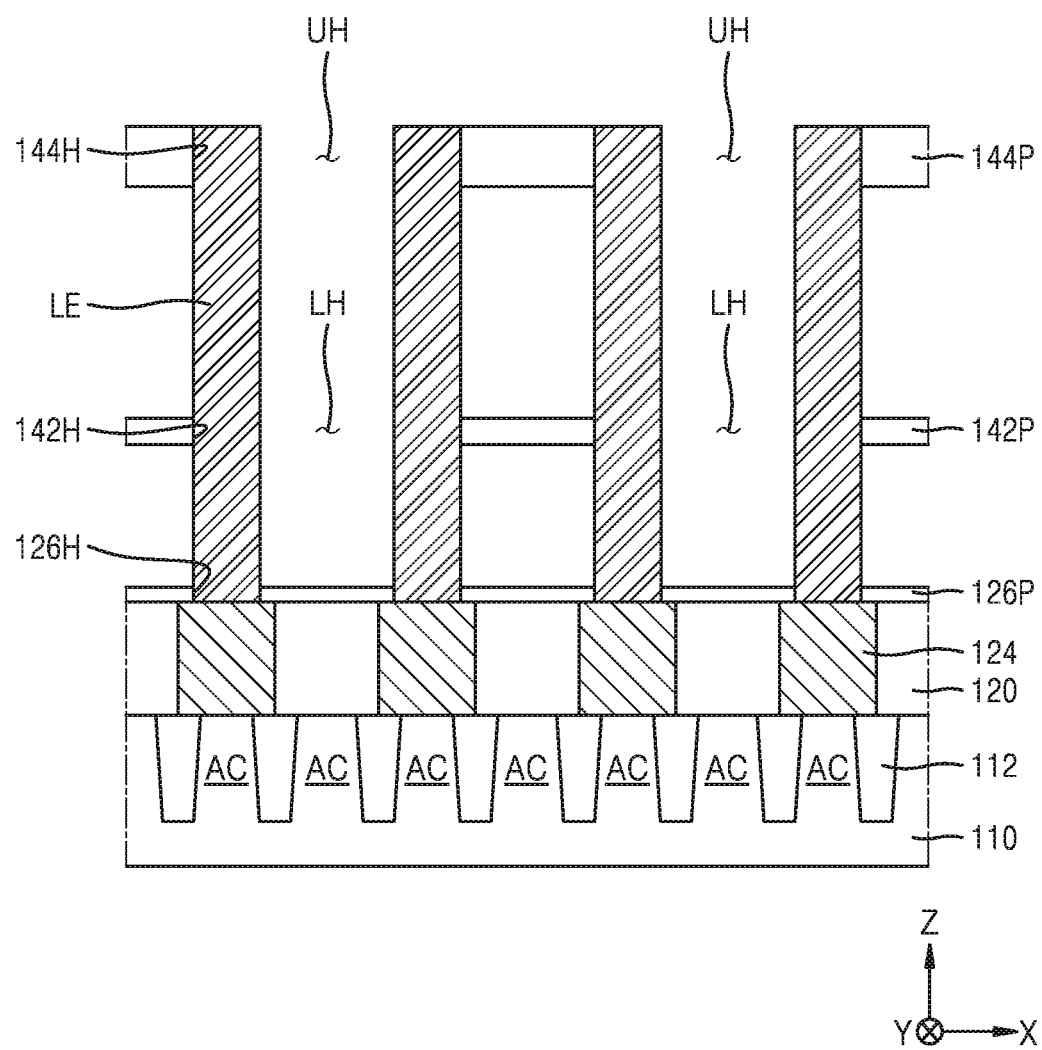

Referring to FIG. 9E, the plurality of upper holes UH may be formed by partially removing the upper insulating support pattern 144P from a resulting product of FIG. 9D. Then, the second mold pattern 134P may be removed in a wet manner through the plurality of upper holes UH. Next, the plurality of lower holes LH may be formed by partially removing the lower insulating support pattern 142P exposed by the plurality of upper holes UH. Then, the top surface of the insulating pattern 126P may be exposed by removing the first mold pattern 132P in a wet manner through the plurality of lower holes LH. After the first mold pattern 132P and the second mold pattern 134P are removed, sidewalls of the plurality of lower electrodes LE may be exposed.

A planar shape of each of the plurality of upper holes UH and the plurality of lower holes LH may vary across embodiments. For example, the planar shape of each of the plurality of upper holes UH may be the same as the example shown in FIG. 2A, but the inventive concept is not limited thereto. For example, the planar shape of each of the plurality of upper holes UH may be a polygonal shape, a curved shape, an irregular shape, or the like.

In example embodiments, to remove the second mold pattern 134P and the first mold pattern 132P in a wet manner, an etchant including ammonium fluoride ($NH_4F$), hydrofluoric acid (HF), and water may be used, but the inventive concept is not limited thereto.

Figure 9F:
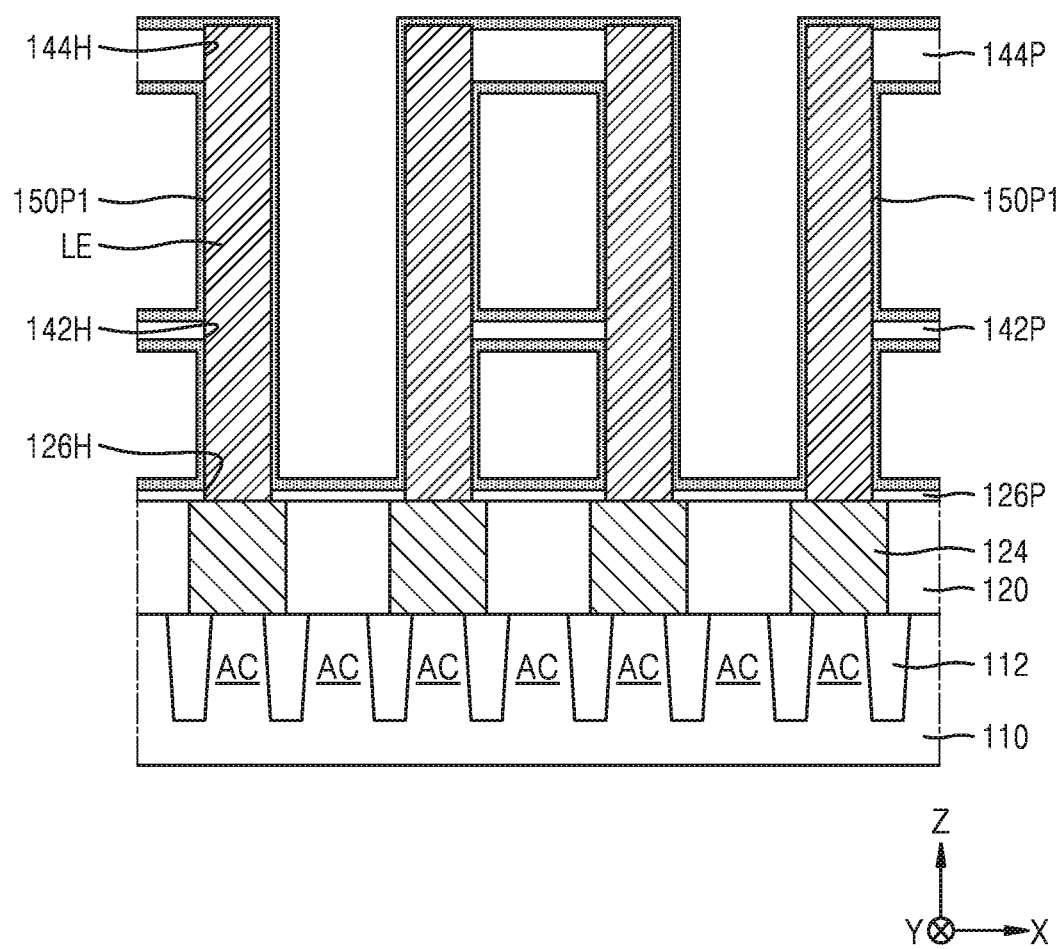

Referring to FIG. 9F, a first interface layer 150P1 may be formed to cover exposed surfaces of a resulting product of FIG. 9E.

The first interface layer 150P1 may include a material having a relatively broad band gap energy of about 5 eV or more. In example embodiments, the first interface layer 150P1 may include a zirconium oxide layer. For example, the high-k interface layer 150 may include $ZrO_2$.

The first interface layer 150P1 may conformally cover respective surfaces of the plurality of lower electrodes LE, the lower insulating support pattern 142P, the upper insulating support pattern 144P, and the insulating pattern 126P. The first interface layer 150P1 may contact the lower electrode LE, the lower insulating support pattern 142P, the upper insulating support pattern 144P, and the insulating pattern 126P.

The surface roughness of an exposed surface of each of the lower insulating support pattern 142P, the upper insulating support pattern 144P, and the insulating pattern 126P, which are formed by CVD processes, may be greater than the surface roughness of exposed surfaces of the plurality of lower electrodes LE formed by an ALD process. Further, a density of each of the lower insulating support pattern 142P, the upper insulating support pattern 144P, and the insulating pattern 126P, which are formed by the CVD processes, may be lower than a density of the plurality of lower electrodes LE formed by the ALD process. Accordingly, portions of the first interface layer 150P1, which are formed on the exposed surfaces of the lower insulating support pattern 142P, the upper insulating support pattern 144P, and the insulating pattern 126P, may include portions which permeate into the lower insulating support pattern 142P, the upper insulating support pattern 144P, and the insulating pattern 126P through spaces between grain boundaries of insulating grains of the first interface layer 150P1. The permeating portions of the first interface layer 150P1 form a relatively less dense structure in each of the lower insulating support pattern 142P, the upper insulating support pattern 144P, and the insulating pattern 126P. As a result, the thickness of the portions of the first interface layer 150P1, which are formed on the insulating support pattern 142P, the upper insulating support pattern 144P, and the insulating pattern 126P, may be greater than the thickness of portions of the first interface layer 150P1, which are formed on the plurality of lower electrodes LE.

To form the first interface layer 150P1, an ALD process may be used. In example embodiments, an ALD process for forming the first interface layer 150P1 includes an ALD cycle that may be repeated a plurality of times. The ALD cycle includes a process of supplying a Zr precursor, which includes a central atom including zirconium (Zr) and at least one ligand bonded to the central atom, onto the substrate 110, a process of removing unnecessary by-products on the substrate 110 and a physisorbed layer of the Zr precursor remaining on the substrate 110 by supplying a purge gas onto the substrate 110, a process of supplying an oxidizing gas onto the substrate 110, and a process of removing unnecessary by-products on the substrate 110 and the residue of the oxidizing gas by supplying the purge gas onto the substrate 110.

The ligand included in the Zr precursor may include, but is not limited to, a C5 to C12 cyclopentadienyl group, a C1 to C10 saturated or unsaturated hydrocarbon group, a C1 to C10 organic amine group, a C5 to C20 β-diketonato group, a C5 to C20 β-ketoiminato group, a C5 to C20 β-diiminato group, or a halogen element. For example, the Zr precursor may include, but is not limited to, tetrakis(ethylmethylamino)zirconium (TEMAZ), tris(dimethylamino)cyclopentadienyl zirconium, $(C_5H_5)Zr[N(CH_3)_2]_3$, $Zr(i-OPr)_4$, $Zr(TMHD)(i-OPr)_3$, $Zr(TMHD)_2(i-OPr)_2$, $Zr(TMHD)_4$, $Zr(DMAE)_4$, $Zr(METHD)_4$, or a derivative thereof. (Here, i-OPr=isopropoxide; TMHD=2,2,6,6-tetramethyl-3,5-heptanedionate; DMAE=dimethylaminoethoxide; and METHD=methoxyethoxytetramethylheptanedionate).

An inert gas such as Ar, He, or Ne, $N_2$ gas, or the like may be used as the purge gas. The oxidizing gas may be selected from among $O_2$, $O_3$, $H_2O$, $NO_2$, NO, $N_2O$ (nitrous oxide), CO, $CO_2$, $H_2O_2$, HCOOH, $CH_3COOH$, $(CH_3CO)_2O$, alcohol, peroxide, sulfur oxide, plasma $O_2$, remote plasma $O_2$, plasma $N_2O$, plasma $H_2O$, and/or a combination thereof.

When the ALD process for forming the first interface layer 150P1 is performed, a process temperature may be maintained at about 100° C. to about 600° C., and a process pressure may be maintained at about 10 Pa to atmospheric pressure. In example embodiments, to form the first interface layer 150P1, one Zr precursor or a combination of at least two Zr precursors may be supplied onto the substrate 110. In some embodiments, to form the first interface layer 150P1, a precursor including a metallic element other than Zr, for example, a Ti precursor, may be supplied onto the substrate 110 along with a Zr precursor.

In some embodiments, to obtain a structure in which the thicknesses of the portions of the first interface layer 150P1 formed on the lower insulating support pattern 142P, the upper insulating support pattern 144P, and the insulating pattern 126P are greater than the thicknesses of the portions of the first interface layer 150P1 respectively formed on the plurality of lower electrodes LE, an area selective deposition (ASD) process may be used. The ASD process may be a process in which an ALD process is performed under a process condition where a deposition rate is higher on the exposed surface of each of the lower insulating support pattern 142P, the upper insulating support pattern 144P, and the insulating pattern 126P than on the exposed surfaces of the plurality of lower electrodes LE from among the exposed surfaces of a resulting product of FIG. 9E, may be used.

In example embodiments, the first interface layer 150P1 may have, but is not limited to, a thickness that is between about 0 nm and about 2 nm, for example, a thickness that is between about 0 nm and about 1 nm.

Figure 9G:
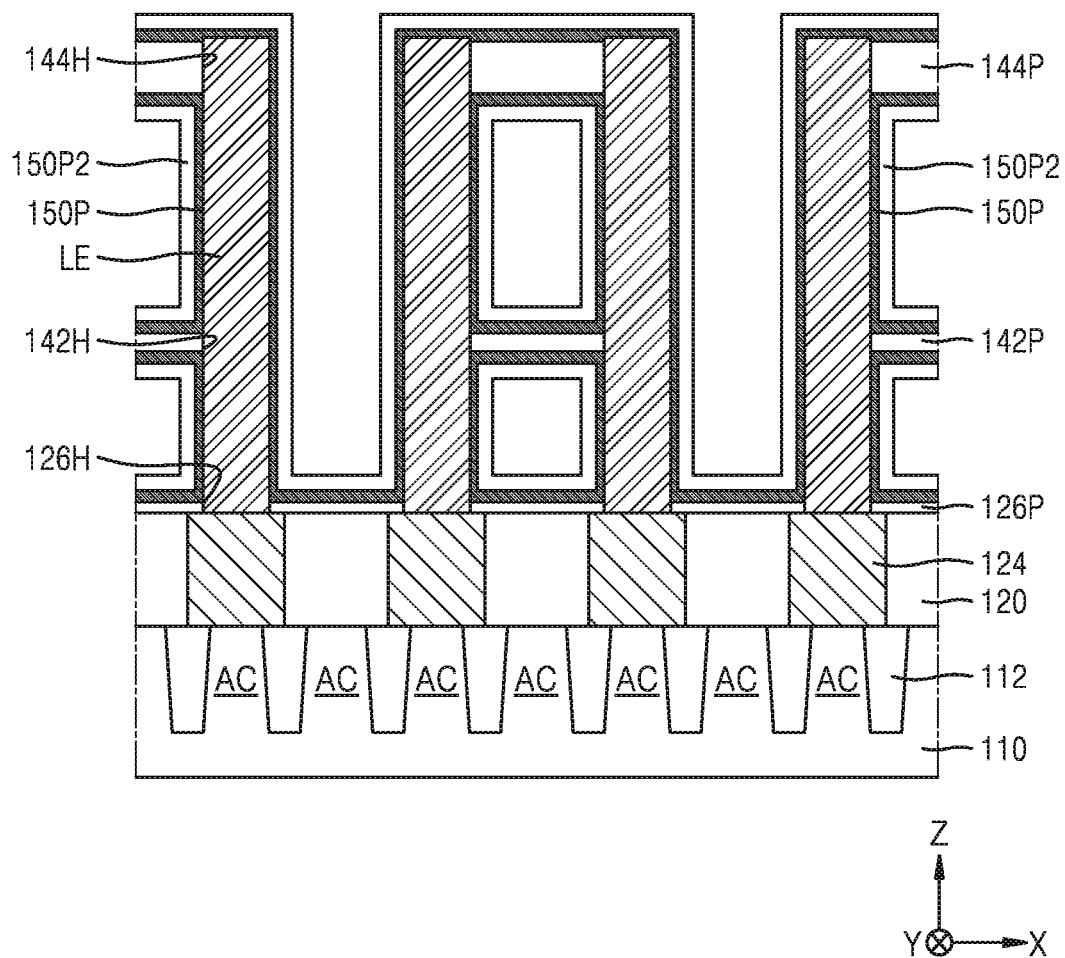

Referring to FIG. 9G, in a resulting product of FIG. 9F, a second interface layer 150P2 may be formed to cover exposed surfaces of the first interface layer 150P1. While the second interface layer 150P2 is formed, the first interface layer 150P1 of FIG. 9F may be changed into a doped interface layer 150P.

The second interface layer 150P2 may include a metal oxide film including at least one metallic element. The at least one metallic element may be a metallic element that is different from Zr. In example embodiments, the second interface layer 150P2 may include a single $TiO_2$ layer, a single $Nb_2O_5$ layer, or a multilayer including a combination thereof.

To form the second interface layer 150P2, an ALD process may be used. When the ALD process for forming the second interface layer 150P2 is performed, a process temperature may be maintained at about 100° C. to about 600° C., and a process pressure may be maintained at about 10 Pa to atmospheric pressure.

When the second interface layer 150P2 includes a $TiO_2$ layer, an ALD process using a Ti precursor may be performed to form the $TiO_2$ layer. The Ti precursor may include, but is not limited to, titanium tetrachloride ($TiCl_4$), titanium tetrafluoride ($TiF_4$), titanium tetrakis(isopropoxide), cyclopentadienyl titanium, titanium bis(isopropoxide)bis(2,2,6,6-tetramethyl-3,5-heptanedionate), tetrakisdimethylaminotitanium, tetrakis(diethylamino)titanium, trimethoxy (pentamethylcyclopentadienyl)titanium, or a derivative thereof.

When the second interface layer 150P2 includes an $Nb_2O_5$ layer, an ALD process using an Nb precursor may be performed to form the $Nb_2O_5$ layer. The Nb precursor may include, but is not limited to, niobium pentachloride ($NbCl_5$), niobium pentafluoride (NbFs), pentakisdimethylaminoniobium (PDMAN, $Nb(N(CH_3)_2)_5$), pentakisdiethylaminoniobium (PDEAN), pentakis(methylethylamido)niobium (PMEAN), tert-butyliminotris(dimethylamino) niobium (TBTDMN), tert-butyliminotris(diethylamino) niobium (TBTDEN), tert-butyliminotris(methylethylamino) niobium (TBTMEN), ethylimido-tris(dimethylamido) niobium, ethylimido-tris(diethylamido)niobium, ethylimido-tris(ethylmethylamido)niobium, tert-amylimido-tris(dimethylamido)niobium (NBIMANB), tert-amylimido-tris(diethylamido)niobium (NBIEANB), tert-amylimido-tris(ethylmethylamido)niobium (NBIMANB), or a derivative thereof.

While the second interface layer 150P2 is formed, metallic elements constituting the second interface layer 150P2 may diffuse into the first interface layer 150P1, or Zr constituting the first interface layer 150P1 may be intermixed with the metallic elements constituting the second interface layer 150P2. As a result, the first interface layer 150P1 shown in FIG. 9F may be changed into the doped interface layer 150P while the second interface layer 150P2 is formed. In example embodiments, the doped interface layer 150P may include, but is not limited to, a zirconium oxide layer doped with Ti, a zirconium oxide layer doped with Nb, a zirconium oxide layer doped with Ti and Nb, or a combination thereof.

In some embodiments, after the second interface layer 150P2 is formed in the process of FIG. 9G, the first interface layer 150P1 of FIG. 9F may remain as the first interface layer 150P1 including an undoped zirconium oxide layer instead of being changed into the doped interface layer 150P.

Figure 9H:
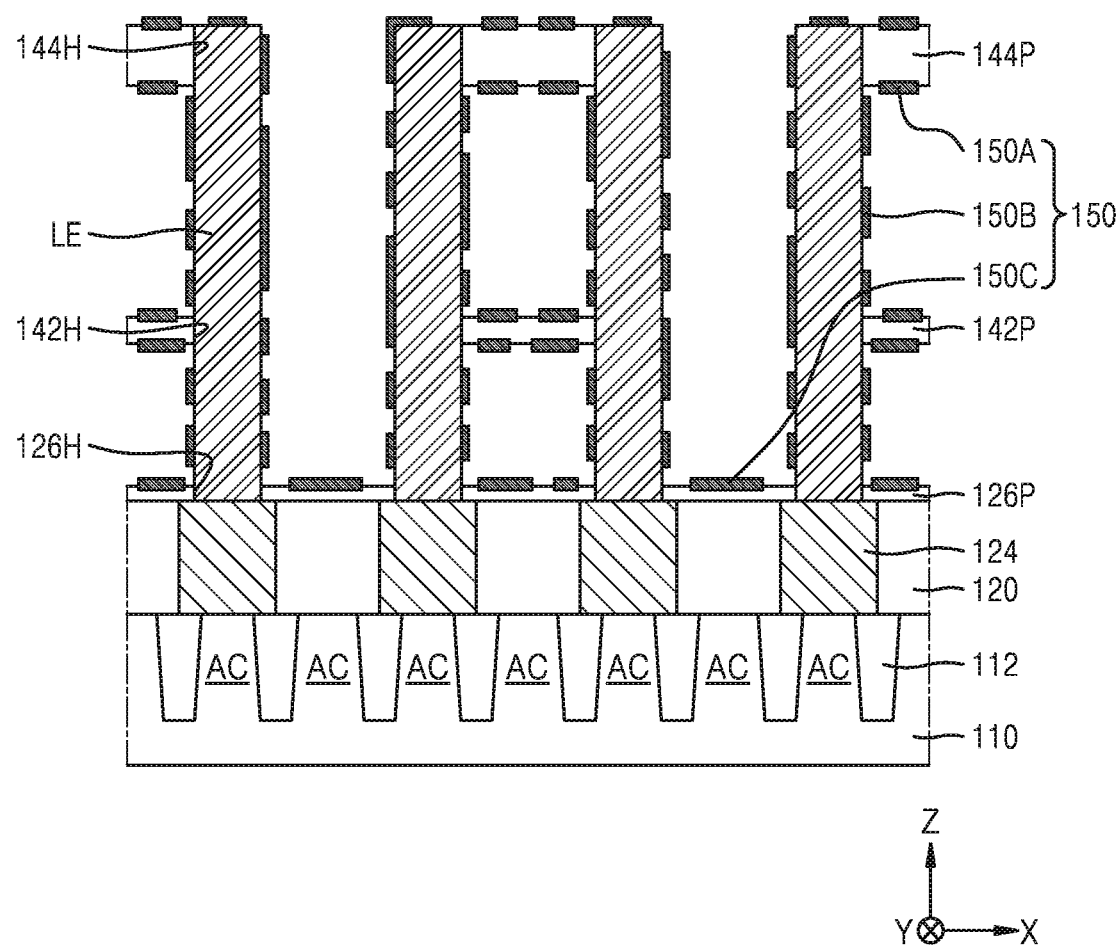

Referring to FIG. 9H, the second interface layer 150P2 may be removed from a resulting product of FIG. 9G, and a portion of the doped interface layer 150P may be removed, thereby forming the high-k interface layer 150, which includes the remaining portion of the doped interface layer 150P.

In example embodiments, a process of removing the second interface layer 150P2 and a process of removing the portion of the doped interface layer 150P may be performed by a wet process using a hydrofluoric acid (HF) solution. In this case, the high-k interface layer 150, which includes a plurality of interface clusters having a plurality of island shapes apart from each other as shown in FIG. 9H, may be obtained along with a reduction in the thickness of the doped interface layer 150P, which remains on a resulting product obtained after the portion of the doped interface layer 150P is removed.

In some embodiments, the process of forming the second interface layer 150P2, which is described with reference to FIG. 9G, may be omitted. In this case, in the process described with reference to FIG. 9H, the high-k interface layer 150 may be formed by performing a process of removing a portion of the first interface layer 150P1 formed in the process of FIG. 9F, without the need to perform a process of removing the second interface layer 150P2.

Figure 9I:
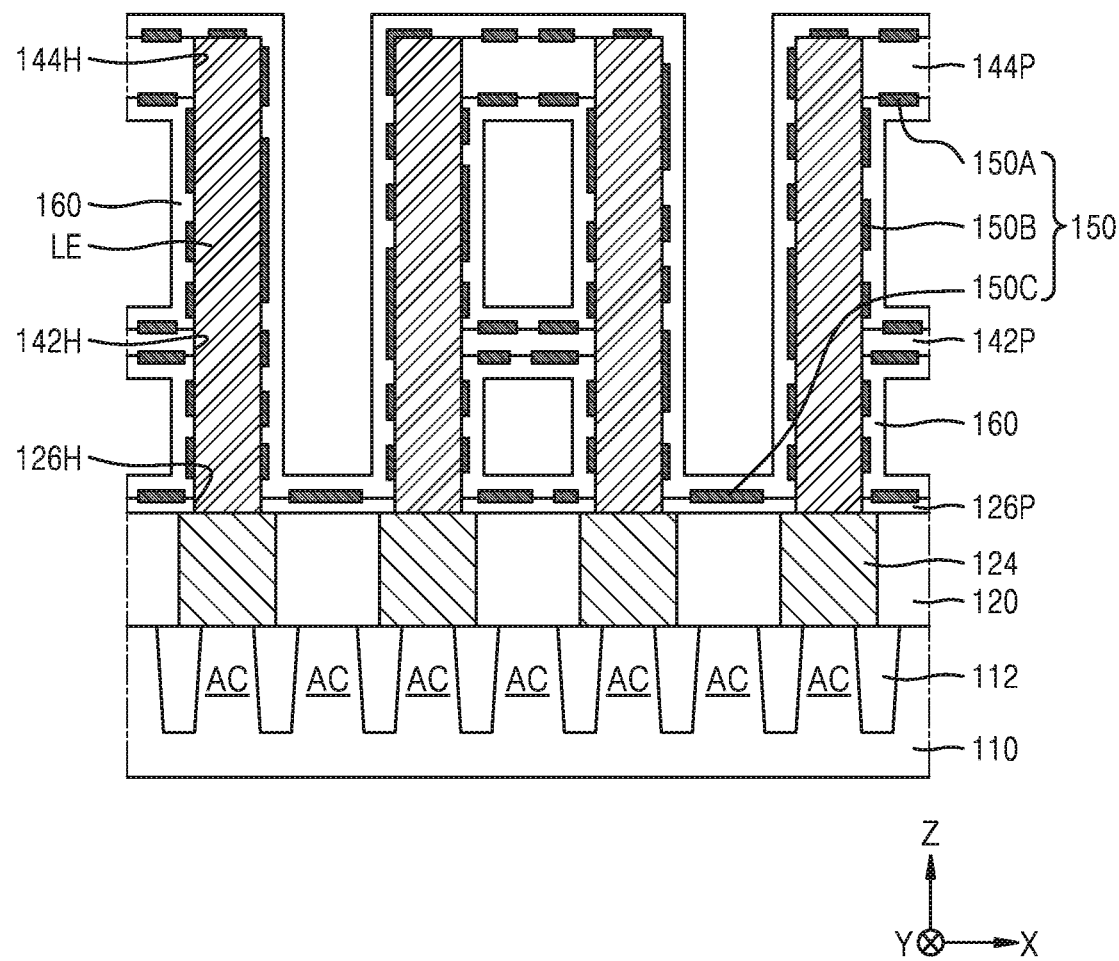

Referring to FIG. 9I, the dielectric film 160 may be formed on a resulting product of FIG. 9H, in which the high-k interface layer 150 is formed.

To form the dielectric film 160, an ALD process may be used. The dielectric film 160 may include, but is not limited to, $HfO_2$, $ZrO_2$, $Al_2O_3$, $La_2O_3$, $Ta_2O_3$, $Nb_2O_5$, $CeO_2$, $TiO_2$, $GeO_2$, or a combination thereof.

Next, in a resulting product of FIG. 9I, the upper electrode UE may be formed to cover the dielectric film 160, thereby manufacturing the integrated circuit device 100, which includes the capacitor CP1 shown in FIG. 2B. In example embodiments, to form the upper electrode UE, a CVD, metal organic CVD (MOCVD), physical vapor deposition (PVD), or ALD process may be used.

Figure 10:
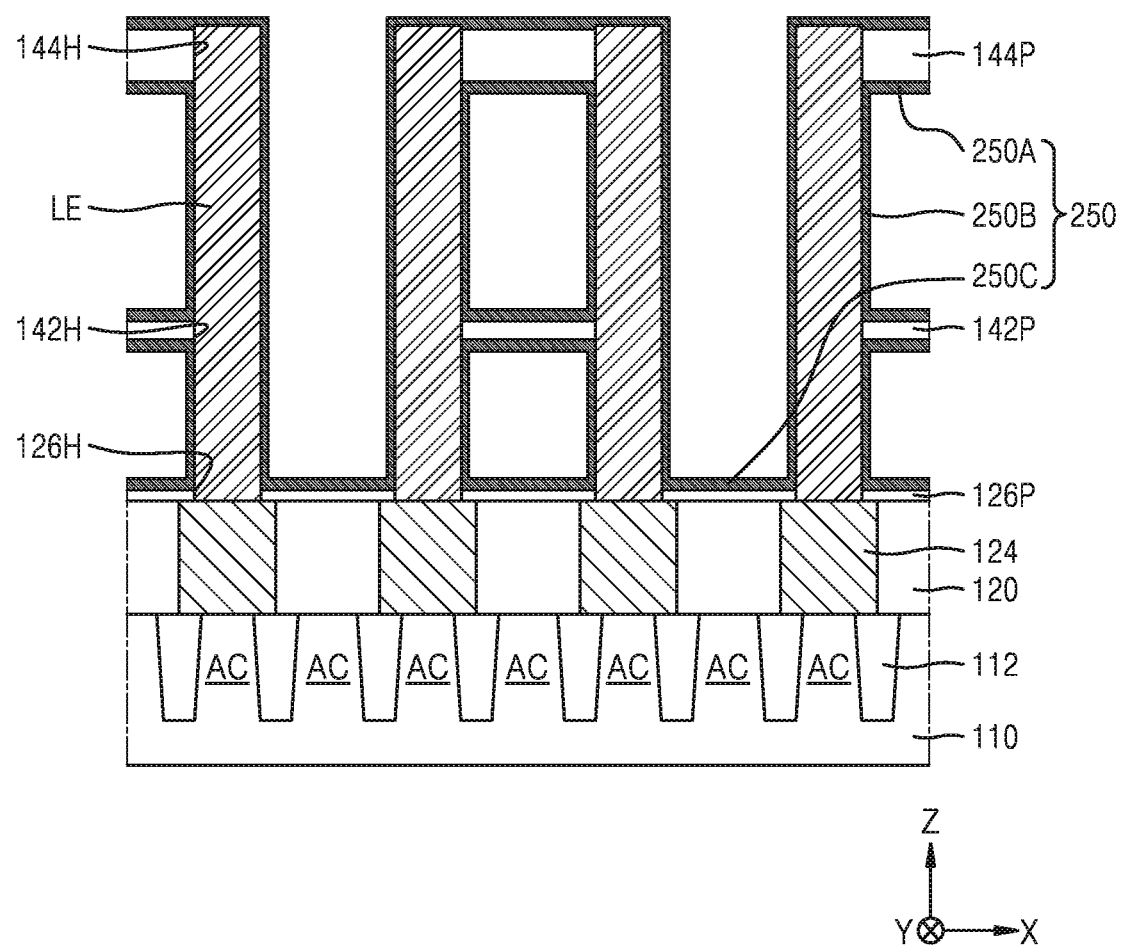
FIG. 10 is a cross-sectional view that illustrates a method of manufacturing an integrated circuit device, according to other embodiments of the inventive concept.

FIG. 10 is a cross-sectional view that illustrates a method of manufacturing an integrated circuit device, according to other embodiments of the inventive concept. In FIG. 10, the same reference numerals as in FIGS. 1 to 9I denote the same members, and here, repeated detailed descriptions thereof are omitted for brevity.

Referring to FIG. 10, the method described with reference to FIGS. 9A to 9G, up to the process of forming the second interface layer 150P2, which at least partially covers the exposed surfaces of the first interface layer 150P1, may be performed. The first interface layer 150P1 formed in the process of FIG. 9F may be changed into the doped interface layer 150P while the second interface layer 150P2 is formed.

Next, the second interface layer 150P2 may be removed from the resulting product of FIG. 9G by a method similar to that described with reference to FIG. 9H, thereby forming the high-k interface layer 250, which includes at least a portion of the doped interface layer 150P.

To form the high-k interface layer 250, the second interface layer 150P2 may be removed as described with reference to FIG. 9H to expose the doped interface layer 150P. Then, the doped interface layer 150P may be scarcely removed, or may be removed only by as much as a relatively small thickness. As a result, the remaining doped interface layer 150P may constitute the high-k interface layer 250.

The first interface portion 250A of the high-k interface layer 250 may continuously extend on the surface of each of the lower insulating support pattern 142P and the upper insulating support pattern 144P. The second interface portion 250B of the high-k interface layer 250 may continuously extend on the surface of the lower electrode LE without interruption. The third interface portion 250C of the high-k interface layer 250 may continuously extend on the surface of the insulating pattern 126P without interruption. The first interface portion 250A, the second interface portion 250B, and the third interface portion 250C of the high-k interface layer 250 may be integrally connected to each other.

Next, the dielectric film 160 may be formed by the method described with reference to FIG. 9I, and the upper electrode UE may be formed to cover the dielectric film 160, thereby manufacturing the integrated circuit device 200, which includes the capacitor CP2 shown in FIG. 6.

To form the high-k interface layer 150 or 250 between each of the lower insulating support pattern 142P, the upper insulating support pattern 144P, the insulating pattern 126P, and the lower electrode LE and the dielectric film 160 covering these components, the first interface layer 150P1 including a zirconium oxide layer, which contacts the exposed surface of each of the lower insulating support pattern 142P, the upper insulating support pattern 144P, the insulating pattern 126P, and the lower electrode LE, is formed according to the methods of manufacturing the integrated circuit devices 100 and 200 as described with reference to FIGS. 9A to 9I and 10. Next, the second interface layer 150P2 may be formed to cover the exposed surfaces of the first interface layer 150P1 as described with reference to FIG. 9G, and the high-k interface layer 150 or 250 may be formed from the first interface layer 150P1 or the doped interface layer 150P obtained from the first interface layer 150P1. The first interface layer 150P1 may include a zirconium oxide layer having a relatively high band gap energy.

Accordingly, the generation of a leakage current through a portion of the high-k interface layer 150 or 250, which covers the lower insulating support pattern 142P and/or the upper insulating support pattern 144P, may be suppressed. For example, the high-k interface layer 150 or 250 may be obtained from the first interface layer 150P1 as described in the above processes with reference to FIGS. 9A-9I and FIG. 10. In addition, the high-k interface layer 150 or 250 may be arranged between the lower electrode LE and the dielectric film 160, thereby preventing an undesired depletion layer from being generated in a portion of the lower electrode LE, which is adjacent to the dielectric film 160. Therefore, the generation of a leakage current in the capacitor CP1 or CP2 may be suppressed, the minimum value of capacitance (Cmin) of the capacitor CP1 or CP2 and the total capacitance thereof may be increased, and the mass-productivity and reliability of the integrated circuit device 100 or 200 may be increased.

While the inventive concept has been particularly shown and described with reference to embodiments thereof, it will be understood that various changes in form and details may be made therein without departing from the spirit and scope of the following claims.

What is claimed is:

1. An integrated circuit device comprising:
a lower electrode disposed on a substrate;
an insulating support pattern supporting the lower electrode;
a dielectric film surrounding the lower electrode and the insulating support pattern;
a high-k interface layer, wherein the high-k interface layer is arranged between the lower electrode and the dielectric film and between the insulating support pattern and the dielectric film, and wherein the high-k interface layer contacts the insulating support pattern and comprises a zirconium oxide layer; and
an upper electrode disposed adjacent to the lower electrode, wherein the high-k interface layer and the dielectric film are disposed between the upper electrode and the lower electrode.

2. The integrated circuit device of claim 1, wherein the high-k interface layer contacts both the lower electrode and the insulating support pattern.

3. The integrated circuit device of claim 1, wherein the high-k interface layer comprises a first interface portion disposed between the insulating support pattern and the dielectric film, and further comprises a second interface portion disposed between the lower electrode and the dielectric film,
wherein both the first interface portion and the second interface portion each comprise a plurality of interface clusters having a plurality of island shapes spaced apart from each other, and
wherein the dielectric film contacts the insulating support pattern through spaces between each of the plurality of interface clusters of the first interface portion, and further contacts the lower electrode through spaces between each of the plurality of interface clusters of the second interface portion.

4. The integrated circuit device of claim 1, wherein the high-k interface layer comprises:
a first interface portion continuously extending between the insulating support pattern and the dielectric film such that the insulating support pattern and the dielectric film do not contact each other; and
a second interface portion continuously extending between the lower electrode and the dielectric film such that the lower electrode and the dielectric film do not contact each other, and
wherein a thickness of the first interface portion is different from a thickness of the second interface portion.

5. The integrated circuit device of claim 1, wherein the high-k interface layer comprises a first interface portion disposed between the insulating support pattern and the dielectric film and a second interface portion disposed between the lower electrode and the dielectric film, and
wherein a thickness of the first interface portion is greater than a thickness of the second interface portion.

6. The integrated circuit device of claim 1, wherein the high-k interface layer further comprises at least one dopant element comprising a metallic element that is different from zirconium, and
wherein the at least one dopant element comprises a typical metal, a transition metal, or a post-transition metal.

7. The integrated circuit device of claim 1, wherein the high-k interface layer further comprises a dopant element, wherein the dopant element is one of aluminum (Al), niobium (Nb), molybdenum (Mo), ruthenium (Ru), indium (In), tin (Sn), antimony (Sb), scandium (Sc), titanium (Ti), vanadium (V), manganese (Mn), iron (Fe), cobalt (Co), nickel (Ni), arsenic (As), tantalum (Ta), tungsten (W), iridium (Ir), yttrium (Y), or bismuth (Bi).

8. The integrated circuit device of claim 1, further comprising:
an insulating pattern adjacent to a lower end of the lower electrode,
wherein the high-k interface layer comprises a first interface portion disposed between the insulating support pattern and the dielectric film, a second interface portion disposed between the lower electrode and the dielectric film, and a third interface portion disposed between the insulating pattern and the dielectric film, and
wherein a thickness of each of the first interface portion and the third interface portion is greater than a thickness of the second interface portion.

9. An integrated circuit device comprising:
a substrate comprising an active region;
a conductive region disposed on the active region;
a capacitor disposed on the conductive region; and
an insulating support pattern supporting a portion of the capacitor,
wherein the capacitor comprises:
a lower electrode comprising a portion contacting the insulating support pattern;
a dielectric film at least partially surrounding the lower electrode and the insulating support pattern;
a high-k interface layer arranged between the lower electrode and the dielectric film and between the insulating support pattern and the dielectric film, and wherein the high-k interface layer contacts the insulating support pattern, and comprises a zirconium oxide layer; and
an upper electrode disposed adjacent to the lower electrode, wherein the high-k interface layer and the dielectric film are disposed between the upper electrode and the lower electrode.

10. The integrated circuit device of claim 9, wherein the high-k interface layer further comprises at least one dopant element comprising a typical metal, a transition metal, or a post-transition metal.

11. The integrated circuit device of claim 9, wherein the high-k interface layer comprises a first interface portion and a second interface portion, wherein the first interface portion is arranged between the insulating support pattern and the dielectric film and contacts the insulating support pattern, and wherein the second interface portion is arranged between the lower electrode and the dielectric film and contacts the lower electrode,
wherein each of the first interface portion and the second interface portion comprises a plurality of interface clusters having a plurality of island shapes apart from each other, and
wherein the dielectric film contacts the insulating support pattern through spaces between each of the plurality of interface clusters of the first interface portion, and further contacts the lower electrode through spaces between each of the plurality of interface clusters of the second interface portion.

12. The integrated circuit device of claim 9, wherein the high-k interface layer comprises:
a first interface portion continuously extending between the insulating support pattern and the dielectric film such that the insulating support pattern and the dielectric film do not contact each other; and
a second interface portion continuously extending between the lower electrode and the dielectric film such that the lower electrode and the dielectric film do not contact each other, and
wherein a thickness of the first interface portion is greater than a thickness of the second interface portion.

13. The integrated circuit device of claim 9, wherein the insulating support pattern comprises a silicon nitride (SiN) film, a silicon carbonitride (SiCN) film, a silicon boron nitride (SiBN) film, or a combination thereof.

14. The integrated circuit device of claim 9, wherein the lower electrode comprises a first metallic element,
wherein the dielectric film comprises a second metallic element that is different from the first metallic element, and
wherein the high-k interface layer further comprises a dopant element comprising a metallic element that is the same as the first metallic element or the second metallic element.

15. The integrated circuit device of claim 9, wherein the lower electrode comprises a first metallic element,
wherein the dielectric film comprises a second metallic element that is different from the first metallic element, and
wherein the high-k interface layer further comprises at least one dopant element comprising a metallic element that is different from the first metallic element and the second metallic element.

16. The integrated circuit device of claim 9, wherein the high-k interface layer further comprises a dopant element, wherein the dopant element is aluminum (Al), niobium (Nb), molybdenum (Mo), ruthenium (Ru), indium (In), tin (Sn), antimony (Sb), scandium (Sc), titanium (Ti), vanadium (V), manganese (Mn), iron (Fe), cobalt (Co), nickel (Ni), arsenic (As), tantalum (Ta), tungsten (W), iridium (Jr), yttrium (Y), or bismuth (Bi).

17. An integrated circuit device comprising:
a substrate comprising an active region;
a plurality of conductive regions disposed on the active region;
an insulating pattern disposed on the plurality of conductive regions and extending in a horizontal direction parallel to the substrate, the insulating pattern comprising a plurality of openings that vertically overlap the plurality of conductive regions;
a plurality of lower electrodes penetrating the insulating pattern through the plurality of openings and respectively connected to the plurality of conductive regions, wherein each of the plurality of lower electrodes comprises a first metal;
an insulating support pattern disposed apart from the insulating pattern in a vertical direction and extending in the horizontal direction, the insulating support pattern contacting a portion of each of the plurality of lower electrodes to support the plurality of lower electrodes;
a dielectric film surrounding the plurality of lower electrodes, the insulating pattern, and the insulating support pattern;
a high-k interface layer arranged between the plurality of lower electrodes and the dielectric film, between the insulating support pattern and the dielectric film, and between the insulating pattern and the dielectric film, wherein the high-k interface layer contacts the insulating support pattern, and comprises a zirconium oxide layer; and
an upper electrode disposed adjacent to each of the plurality of lower electrodes, wherein the high-k interface layer and the dielectric film are disposed between the upper electrode and each of the plurality of lower electrodes, and wherein the upper electrode comprises a second metal.

18. The integrated circuit device of claim 17, wherein the high-k interface layer comprises a plurality of interface clusters having a plurality of island shapes spaced apart from each other, and
wherein the dielectric film contacts the insulating support pattern, the plurality of lower electrodes, and the insulating pattern through spaces between each of the plurality of interface clusters.

19. The integrated circuit device of claim 17, wherein the high-k interface layer comprises a first interface portion disposed between the insulating support pattern and the dielectric film, a second interface portion disposed between the plurality of lower electrodes and the dielectric film, and a third interface portion contacting the insulating pattern, and
wherein a thickness of each of the first interface portion and the third interface portion is greater than a thickness of the second interface portion.

20. The integrated circuit device of claim 17, wherein each of the plurality of lower electrodes and the upper electrode comprises at least one of TiN, NbN, CoN, $SnO_2$, or a combination thereof,
wherein the dielectric film comprises a metal oxide comprising at least one metal selected from among hafnium (Hf), zirconium (Zr), aluminum (Al), niobium (Nb), cerium (Ce), lanthanum (La), tantalum (Ta), or titanium (Ti), and
wherein the high-k interface layer comprises a zirconium oxide layer further comprising a dopant element, wherein the dopant element is at least one of aluminum (Al), niobium (Nb), molybdenum (Mo), ruthenium (Ru), indium (In), tin (Sn), antimony (Sb), scandium (Sc), titanium (Ti), vanadium (V), manganese (Mn), iron (Fe), cobalt (Co), nickel (Ni), arsenic (As), tantalum (Ta), tungsten (W), iridium (Ir), yttrium (Y), or bismuth (Bi).

* * * * *